(12) United States Patent
Ossman

(10) Patent No.: US 10,778,228 B1
(45) Date of Patent: Sep. 15, 2020

(54) RECONFIGURABLE DATA PROCESSING PIPELINE, AND METHOD OF OPERATING SAME

(71) Applicant: Flex Logix Technologies, Inc., Mountain View, CA (US)

(72) Inventor: Valentin Ossman, Livermore, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 16/661,217

(22) Filed: Oct. 23, 2019

Related U.S. Application Data

(60) Provisional application No. 62/752,750, filed on Oct. 30, 2018.

(51) Int. Cl.
*H03K 19/17736* (2020.01)
*H03K 19/17728* (2020.01)

(52) U.S. Cl.
CPC . *H03K 19/17744* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 8,680,886 B1 * | 3/2014 | Atsatt | H03K 19/17732 326/38 |
| 10,547,313 B2 * | 1/2020 | Auer | G21D 3/00 |
| 2004/0004496 A1 * | 1/2004 | Madurawe | H01L 27/105 326/39 |
| 2008/0258761 A1 | 10/2008 | Hutchings et al. | |
| 2009/0051387 A1 * | 2/2009 | Hutton | H03K 19/17732 326/41 |

* cited by examiner

*Primary Examiner* — Minh D A
*Assistant Examiner* — James H Cho
(74) *Attorney, Agent, or Firm* — Neil A. Steinberg

(57) ABSTRACT

An integrated circuit including an FPGA, configurable to process data via a plurality of data processing operations, and an ASIC, electrically coupled to logic circuitry of the FPGA via switch interconnect network thereof. In one embodiment, the ASIC includes a plurality of circuit blocks, each circuit block configurable to process data via a data processing operation, and selection circuitry, coupled to the logic circuitry of the FPGA and the plurality of circuit blocks of the ASIC, configurable to connect one or more of the plurality of circuit blocks of the ASIC and the logic circuitry of the FPGA into a first circuit configuration to perform a first data processing operation, and in situ, connect one or more of the plurality of circuit blocks of the ASIC and the logic circuitry of the FPGA into a second circuit configuration to perform a second data processing operation.

19 Claims, 26 Drawing Sheets

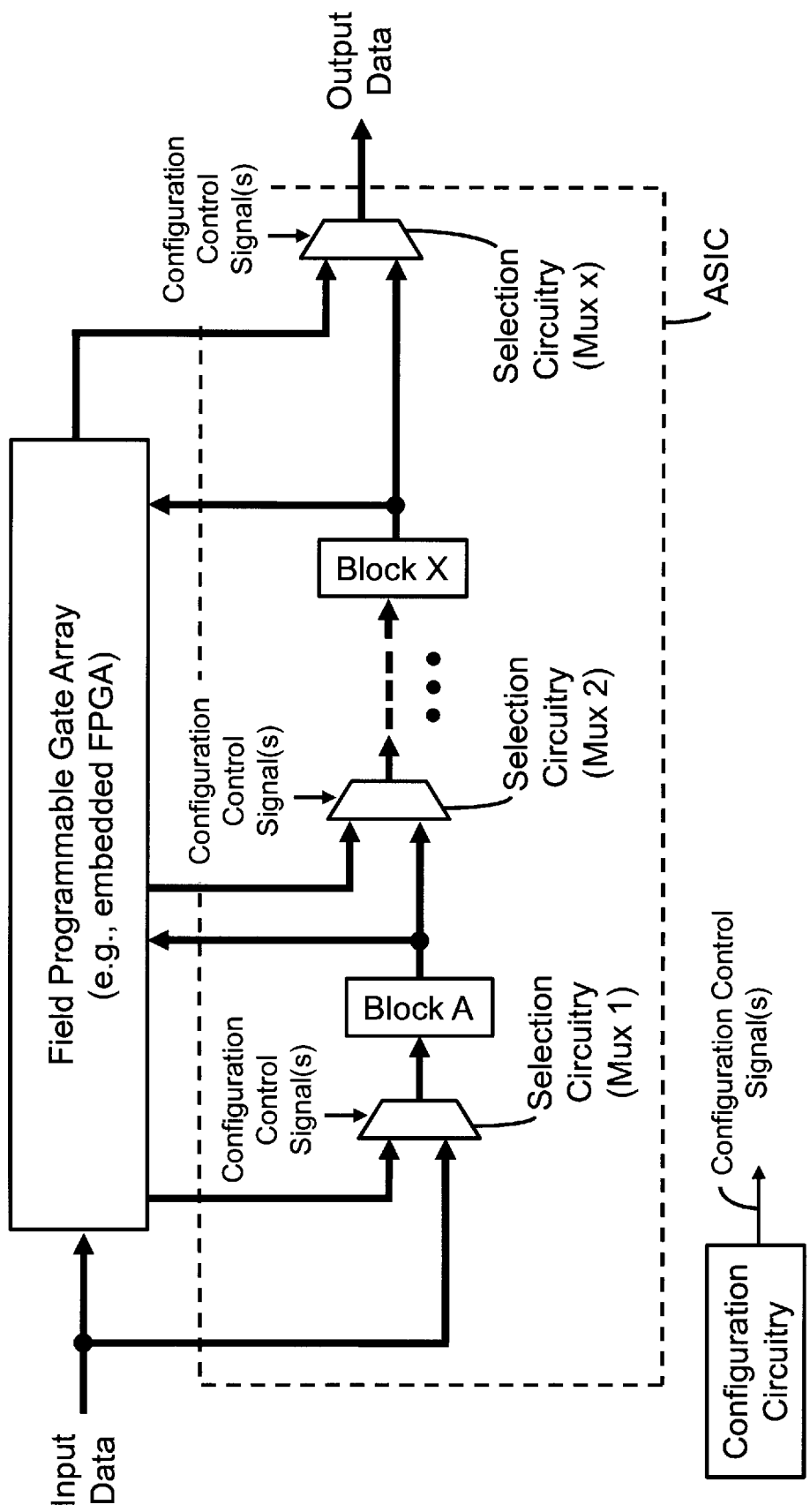

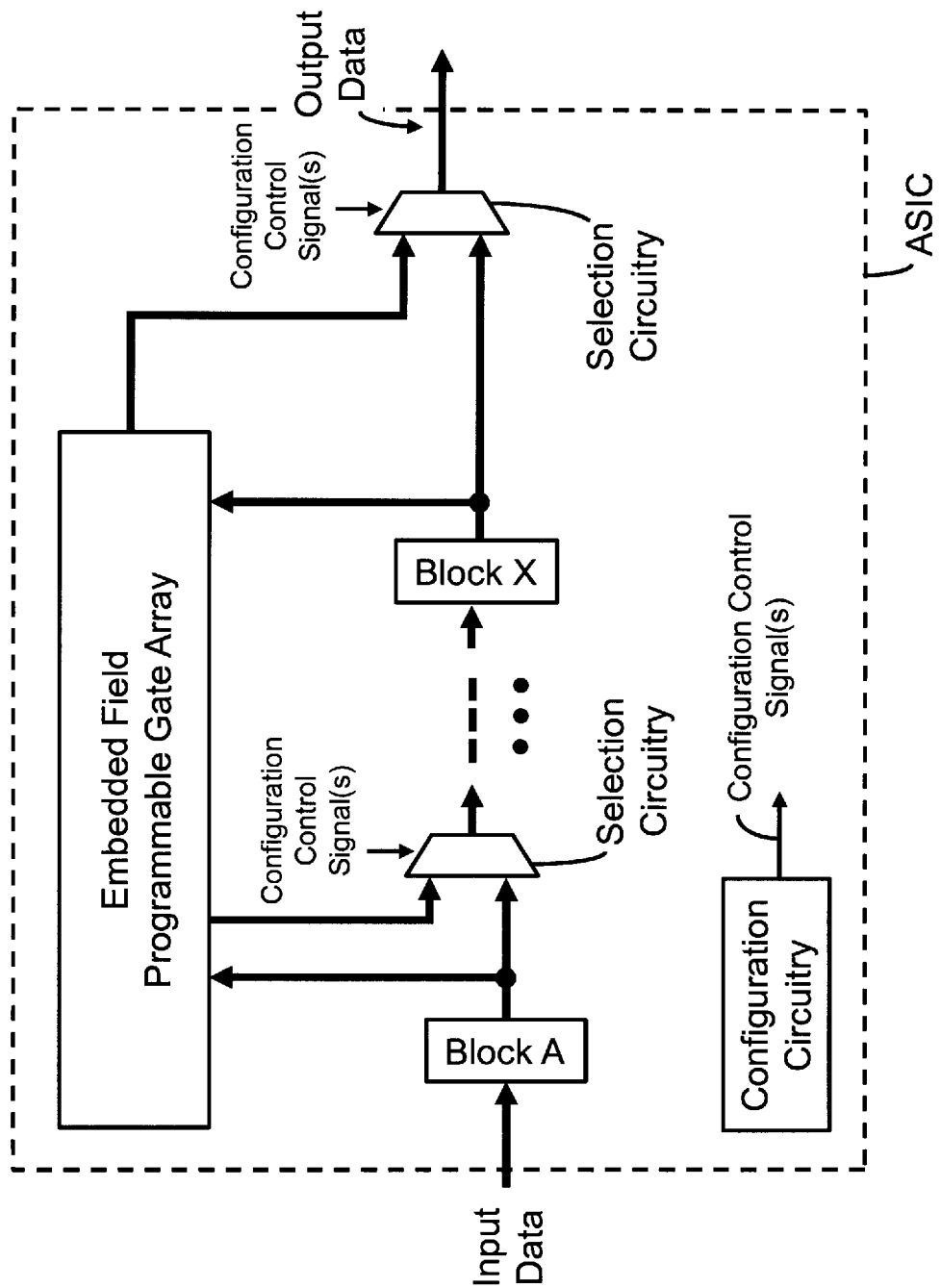

RECONFIGURABLE DATA PROCESSING PIPELINE, AND METHOD OF OPERATING SAME

RELATED APPLICATION

This non-provisional application claims priority to and the benefit of U.S. Provisional Application No. 62/752,750, entitled "Reconfigurable Data Processing Pipeline, and Method of Operating Same", filed Oct. 30, 2018. The '750 provisional application is incorporated herein by reference in its entirety.

INTRODUCTION

In one aspect, the present inventions are directed to an integrated circuit and circuitry of the integrated circuit (e.g., a field programmable gate array ("FPGA") and logic circuitry, for example, an application specific integrated circuit ("ASIC")), having a reconfigurable data processing path or pipeline, and methods of controlling, operating and programming such circuitry. For example, the circuitry and methods of the present inventions facilitate modification of the order, number, and/or type of data processing operation(s), function(s) and/or path(s) of data at or during power-up, start-up, initialization, re-initialization, configuration, re-configuration or the like, and/or in situ (i.e., during normal operation of the integrated circuit). Here, configuration circuitry (which, for example, is disposed in/on the integrated circuit) is employed to program or configure selection circuitry (e.g., multiplexers) and/or the switch interconnect network of the FPGA to establish, program, re-program, define, re-define, configure and/or re-configure an order, a number and/or a type of data processing operation(s), function(s) and/or path(s) of data in the FPGA and/or the ASIC. That is, the configuration circuitry is programmable, configurable and/or reconfigurable during initialization (or at start-up) and/or in situ which defines or configures the data path or pipeline in the FPGA and/or ASIC (i.e., the order, a number and/or a type of data processing operation(s) and/or function(s)) implemented in and between the FPGA and the ASIC.

The configuration circuitry may program or configure the selection circuitry (e.g., a plurality of multiplexers) and/or the switch interconnect network of the FPGA during initialization or at start-up, and/or in situ (i.e., during normal operation). For example, the order, number and/or type of data processing operation(s) or function(s) in/of the data processing or pipeline (implemented by the FPGA and/or ASIC) may be programmed, re-programmed, configured and/or re-configured in situ—that is, for example, after power-up, start-up or performance/completion of the initialization sequence/process (i.e., during normal operation). Here, the configuration circuitry may incorporate/add or remove/delete a type of processing operation(s) or function(s) in/of the path or pipeline of data processing (whether such processing operation(s) or function(s) is performed in or by the FPGA and/or ASIC). In addition thereto, or in lieu thereof, the configuration circuitry may change the order in which certain data processing operation(s) or function(s) are implemented or performed in or by the FPGA and/or ASIC. For example, in one embodiment, the processing operation(s) or function(s) implemented in the data path within the FPGA may be changed (e.g., in order and/or type). In addition thereto, or in lieu thereof, in another embodiment, the configuration circuitry may change (e.g., in order and/or type) the processing operation(s) or function(s) implemented in the data path within the ASIC. In this way, the circuitry and processes of the present inventions provide for a reconfigurable data pipeline of the FPGA and ASIC architecture.

Notably, the processes, functions or operations performed or implemented by circuitry in the FPGA and/or ASIC may include, for example, digital signal processing, encoding, decoding, encrypting, decrypting and/or filtering; all forms of data manipulation are intended to fall within the scope of the present inventions.

BRIEF DESCRIPTION OF THE DRAWINGS

The present inventions may be implemented in connection with embodiments illustrated in the attached drawings. These drawings show different aspects of the present inventions and, where appropriate, reference numerals or names illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as ideal, preferred or advantageous, for example, over other embodiments or implementations; rather, it is intended reflect or indicate the embodiment(s) is/are "example" embodiment(s).

FIGS. 4A, 4B and 4C illustrate, in block diagram form, exemplary reconfigurable data pipelines of an FPGA and ASIC architecture of FIGS. 3B and 3C, according to one or more aspects of the present inventions, wherein the ASIC includes one or more circuit blocks which perform predetermined operation(s) or function(s) and selection circuitry responsively configures the data flow or pipeline (i) within the ASIC and/or (ii) between one or more associated circuit blocks of the ASIC and the FPGA; such an architecture facilities configuration or control of the order, number and/or type of data processing operation(s) or function(s) in/of the data path in the FPGA and/or the ASIC according to one or more aspects of the present inventions; for example, the circuit architecture of FIGS. 4A, 4B and/or 4C may be used to implement a reconfigurable pipeline design such as the examples illustrated in FIGS. 5A-5F wherein the Input Data may be routed and/or re-routed through the ASIC Circuit Blocks and/or the circuit blocks implemented in the FPGA; that is, the order, number and type of the operations implemented/incorporated in the processing path may be changed (at any time—e.g., in situ) because of the reconfigurable nature of the FPGA and the MUX block (e.g., a plurality of multiplexers) architecture; notably, the selection circuitry may be separate from the FPGA and ASIC (see FIG. 4A), partially or fully in the FPGA, or partially or fully in the ASIC (see FIGS. 4B and 4C); notably, the configuration circuitry, controls the selection circuitry and thereby programs, re-programs, defines, re-defines, configures and/ or re-configures the reconfigurable data processing path or pipeline including the order, number and/or type of data processing operation(s) or function(s) of/in the path or pipeline in the FPGA and/or the ASIC;

FIGS. 8A-8D illustrate, in block diagram form, exemplary reconfigurable data pipelines of an ASIC including a plurality of circuit blocks, each performing one or more associated predetermined operations or functions on the data applied thereto, and an embedded FPGA, including logic circuitry to perform a plurality of operations, and selection circuitry, according to one or more aspects of the present inventions, wherein the embedded FPGA includes an interconnect network to facilitate or provide configuration or control of the order, number and/or type of data processing operation(s) or function(s) in/of the data path in the embedded FPGA (via configurations of the interconnect network and connection thereof to one or more computing elements); notably, the one or more circuit blocks of the ASIC perform predetermined operation(s) or function(s) and selection circuitry responsively provides configurable or controllable data flow within the ASIC and/or between the embedded FPGA and the ASIC which facilities configuration or control of the order, number and/or type of data processing operation(s) or function(s) (e.g., digital signal processing, encoding, decoding, encrypting, decrypting and/or filtering) in/of the data path in the embedded FPGA and/or the ASIC; although the selection circuitry is illustrated as being partially or fully in the ASIC, such selection circuitry may be partially or fully separate from the FPGA and ASIC or partially or fully in the ASIC; moreover, the configuration circuitry, controls the selection circuitry and thereby programs, re-programs, defines, re-defines, configures and/or re-configures the reconfigurable data processing path or pipeline including the order, number and/or type of data processing operation(s) or function(s) of/in the path or pipeline in the FPGA and/or the ASIC; in these illustrated embodiments, the FPGA is embedded within the ASIC on the die.

Figure 1:
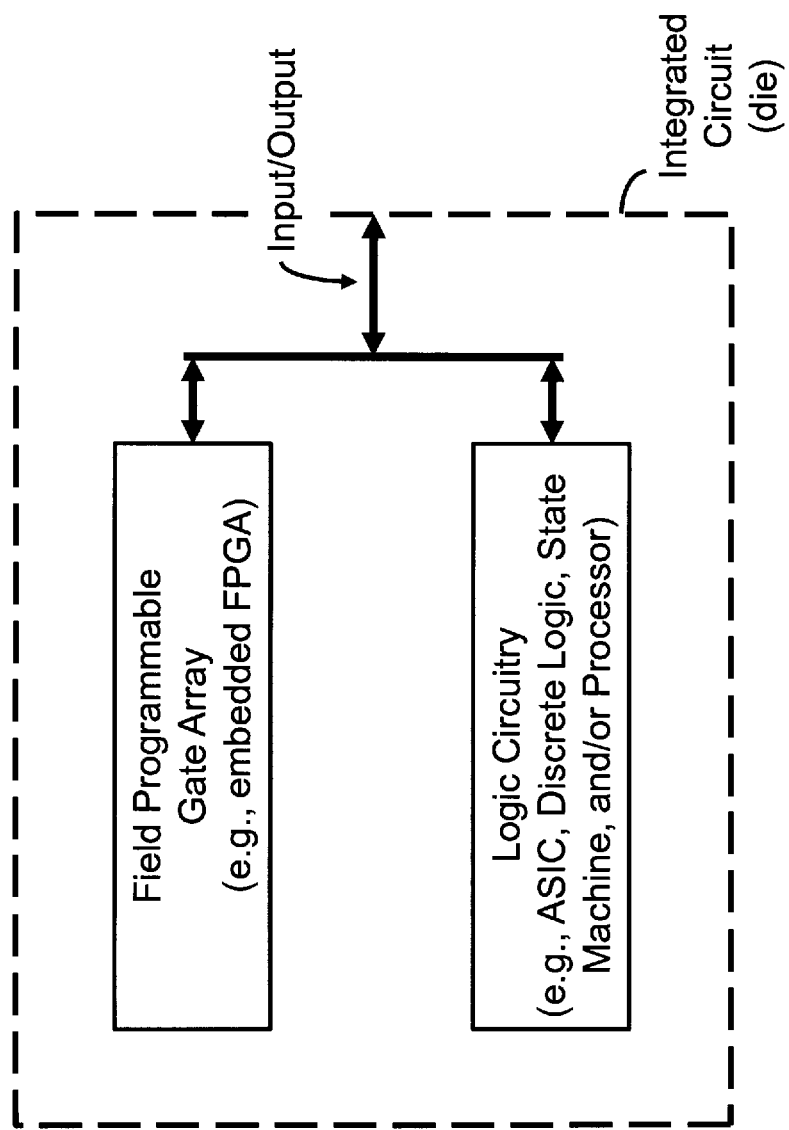
FIG. 1 illustrates block diagram representation of exemplary integrated circuits including a field programmable gate array (e.g., an embedded FPGA) and logic circuitry (e.g., logic circuitry which has a fixed or substantially fixed path of data processing in relation to a data stream (e.g., the input data stream), an application specific integrated circuit ("ASIC")—which, in one embodiment, has a fixed path of data processing in relation to a data stream (e.g., the input data stream), discrete logic, state machine and/or processor) according to one or more aspects of the present inventions wherein a bus may provide a communication path between the FPGA and the logic circuitry (as well as between circuitry external to the integrated circuit and the FPGA and/or the logic circuitry)

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In a first aspect, the present inventions relate to integrated circuit and circuitry of the integrated circuit (including, for example, FPGA (which has a configurable, re-configurable, and/or programmable (i.e., not fixed) path of data processing in relation to a data stream (e.g., the input data stream)) and ASIC (which, in one embodiment, has a fixed path of data processing in relation to a data stream (e.g., the input data stream)), having a reconfigurable data processing path or pipeline, and methods of controlling, operating and programming such circuitry. For example, the circuitry and methods of the present inventions facilitate configuring and/or re-configuring the order and/or type of data processing operation(s) or function(s) implemented in the processing path or pipeline of the data in situ and/or at or during power-up, start-up, initialization, re-initialization or the like. Here, in one embodiment, configuration circuitry (which, for example, may be disposed in/on the integrated circuit and/or in the FPGA and/or the ASIC) is employed to define, program, control or configure selection circuitry (e.g., multiplexers) and/or the switch interconnect network of the FPGA to establish, program, re-program, define, re-define, configure and/or re-configure an order, a number and/or a type of processing operation(s), function(s) and/or path(s) of one some or all of the data in the FPGA and/or the ASIC. That is, the configuration circuitry is programmable, configurable and/or reconfigurable during initialization (or at start-up) and/or in situ which defines or configures the data processing path in the FPGA and/or ASIC (i.e., the order, a number and/or a type of data processing operation(s) and/or function(s)) implemented in the FPGA and/or the ASIC.

The processes, functions or operations of the data processing path may include, for example, digital signal processing, encoding, decoding, encrypting, decrypting and/or filtering; all forms of data manipulation are intended to fall within the scope of the present inventions. Such processes are performed or implemented by circuitry in the FPGA and/or ASIC.

In one embodiment, the configuration circuitry programs or configures the selection circuitry (e.g., a plurality of multiplexers disposed in the data path) and/or the switch interconnect network of the FPGA to configure and/or re-configure the order, number and/or type of data processing operation(s) or function(s) implemented in the data processing path or pipeline in/of the ASIC and/or the FPGA. The configuration circuitry may program or configure the data processing path or pipeline during initialization or at start-up, and/or in situ (i.e., during normal operation). For example, the configuration circuitry may incorporate/add or remove/delete a type of processing operation(s) or function(s) in/of the data path of data processing (whether such processing operation(s) or function(s) is performed in or by the FPGA and/or ASIC). In addition thereto, or in lieu thereof, the configuration circuitry may change the order in which certain data processing operation(s) or function(s) are implemented or performed in or by the FPGA and/or ASIC.

For example, in one embodiment, the configuration circuitry may change the processing operation(s) or function(s), for example, the order and/or type thereof, included, incorporated and/or implemented in the data processing path within the FPGA. In addition thereto, or in lieu thereof, in another embodiment, the configuration circuitry may change (e.g., in order and/or type) the processing operation(s) or function(s) included, incorporated and/or implemented in the data processing path within the ASIC. In this way, the circuitry and processes of the present inventions provide a reconfigurable data pipeline of the FPGA and ASIC architecture.

Notably, the order, number and/or type of data processing operation(s) or function(s) in/of the data processing path or pipeline (implemented by the FPGA and/or ASIC) may be programmed, re-programmed, configured and/or re-configured in situ—that is, for example, after power-up, start-up or performance/completion of the initialization sequence/process (i.e., during normal operation). Moreover, as stated above, the processes, functions or operations performed or implemented by circuitry in the FPGA and/or ASIC may include, for example, digital signal processing, encoding, decoding, encrypting, decrypting, filtering and/or any other forms/types of data manipulation (all of which are intended to fall within the scope of the present inventions.

Figure 2A:
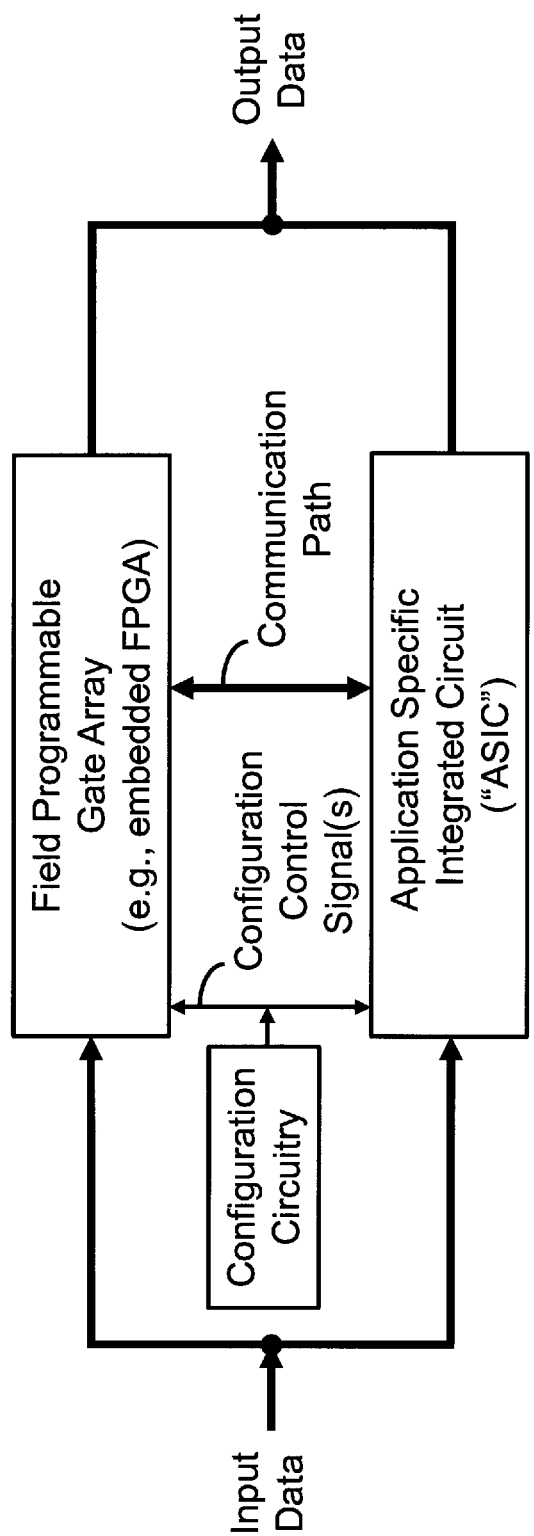
FIGS. 2A and 2B generally illustrate, in block diagram form, exemplary reconfigurable data pipelines of an FPGA and ASIC architecture according to one or more aspects of the present inventions wherein in one embodiment, the architecture includes selection circuitry (e.g., multiplexer circuitry) to responsively provide configurable or controllable data flow, (e.g., in situ control) between the FPGA and the ASIC which, in one embodiment, may be employed to control the order, number and/or type of processing operation(s) or function(s) (e.g., digital signal processing, encoding, decoding, encrypting, decrypting and/or filtering) in/of the data path in the FPGA and/or the ASIC; notably, the configuration circuitry, controls the selection circuitry and thereby programs, re-programs, defines, re-defines, configures and/or re-configures the reconfigurable data processing path or pipeline including the order, number and/or type of data processing operation(s) or function(s) of/in the path or pipeline in the FPGA and/or the ASIC.
Figure 3A:
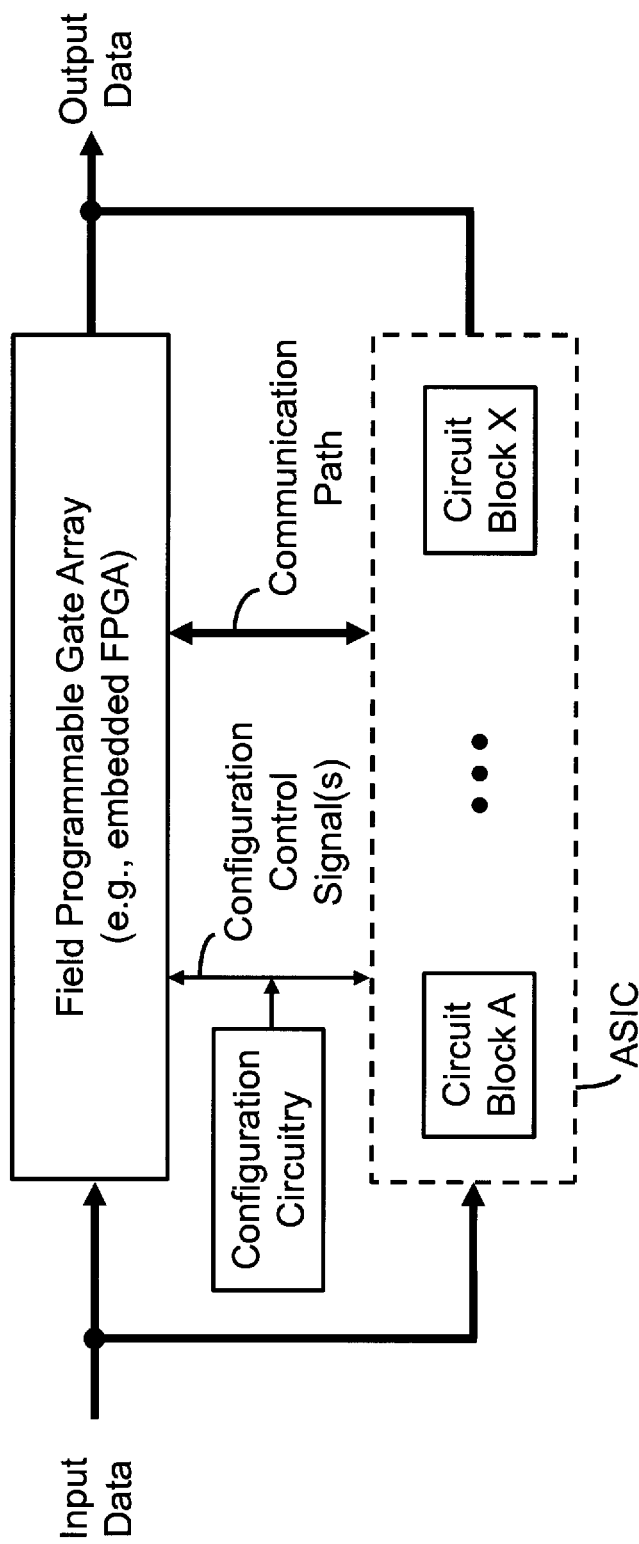
FIGS. 3A-3D illustrate, in block diagram form, exemplary reconfigurable data pipelines of an FPGA and ASIC architecture according to one or more aspects of the present inventions wherein the ASIC includes one or more circuit blocks to perform predetermined specific operation(s) or function(s) (e.g., circuit block A performs operation A in connection with data input thereto) and, in certain embodiments, selection circuitry responsively provides configurable or controllable data flow between the FPGA and the ASIC which facilities configuration or control of the order, number and/or type of processing operation(s) or function(s) in/of the data path in the FPGA and/or the ASIC (e.g., in situ—that is, for example, at any time after power-up, start-up or performance/completion of the initialization sequence/process (i.e., during normal operation)); notably, the selection circuitry may be separate from the FPGA and ASIC (see FIG. 3B), partially or fully in the FPGA, or partially or fully in the ASIC (see FIG. 3C)

With reference to FIGS. 1, 2A and 3A, in one embodiment of the present inventions, the reconfigurable data processing path or pipeline includes an FPGA and ASIC, each having circuitry to implement one or more processing operations or functions. The configuration circuitry controls the reconfigurable data processing path or pipeline by configuring and/or re-configuring the order and/or type of the processing operation(s) or function(s) implemented in the data processing path or pipeline of the data. The configuration circuitry may configure and/or re-configuring the order and/or type of the processing operation(s) or function(s) in situ and/or at or during power-up, start-up, initialization, re-initialization or the like.

Figure 2B:
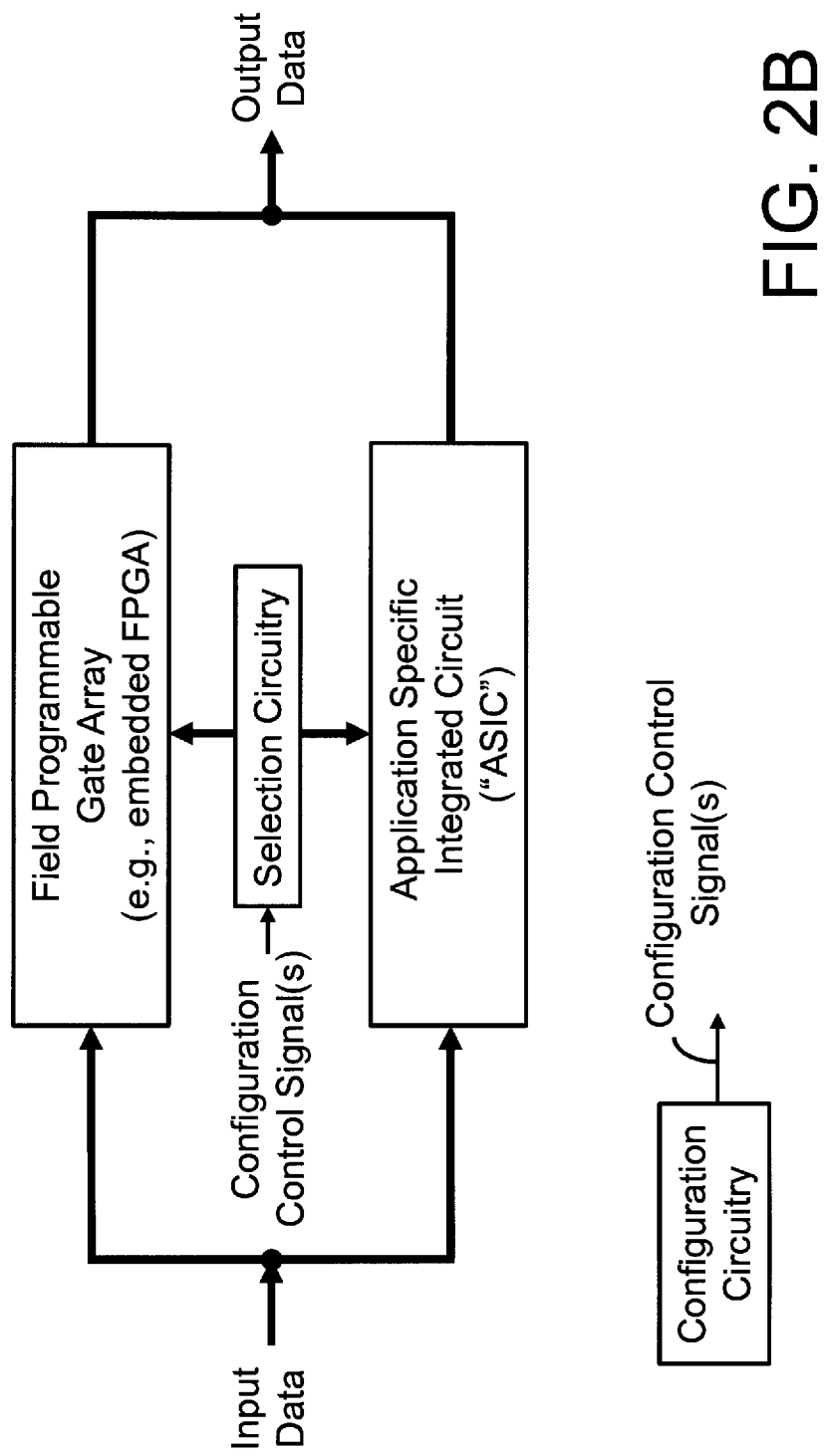
Figure 3B:
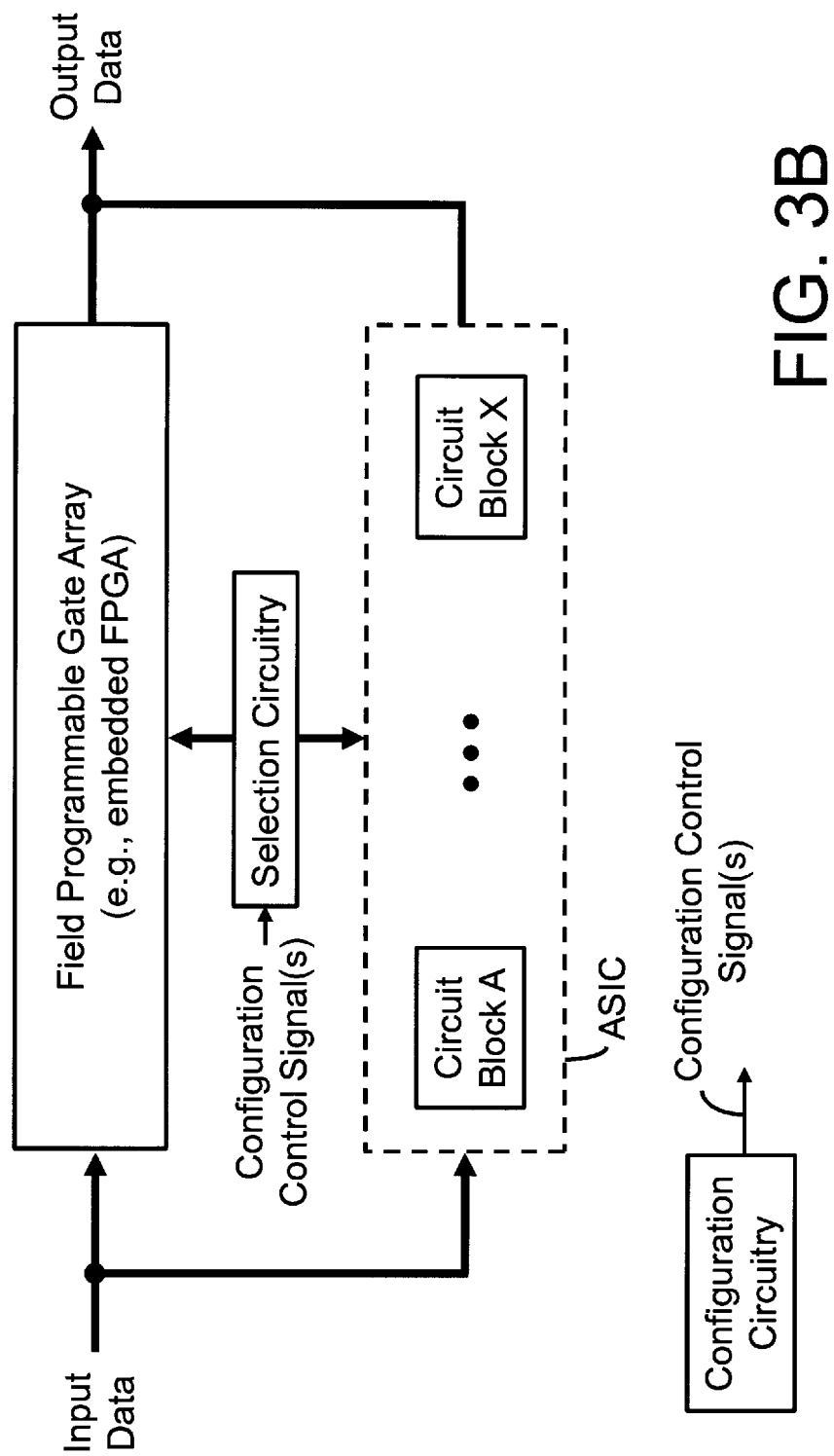
Figure 3C:
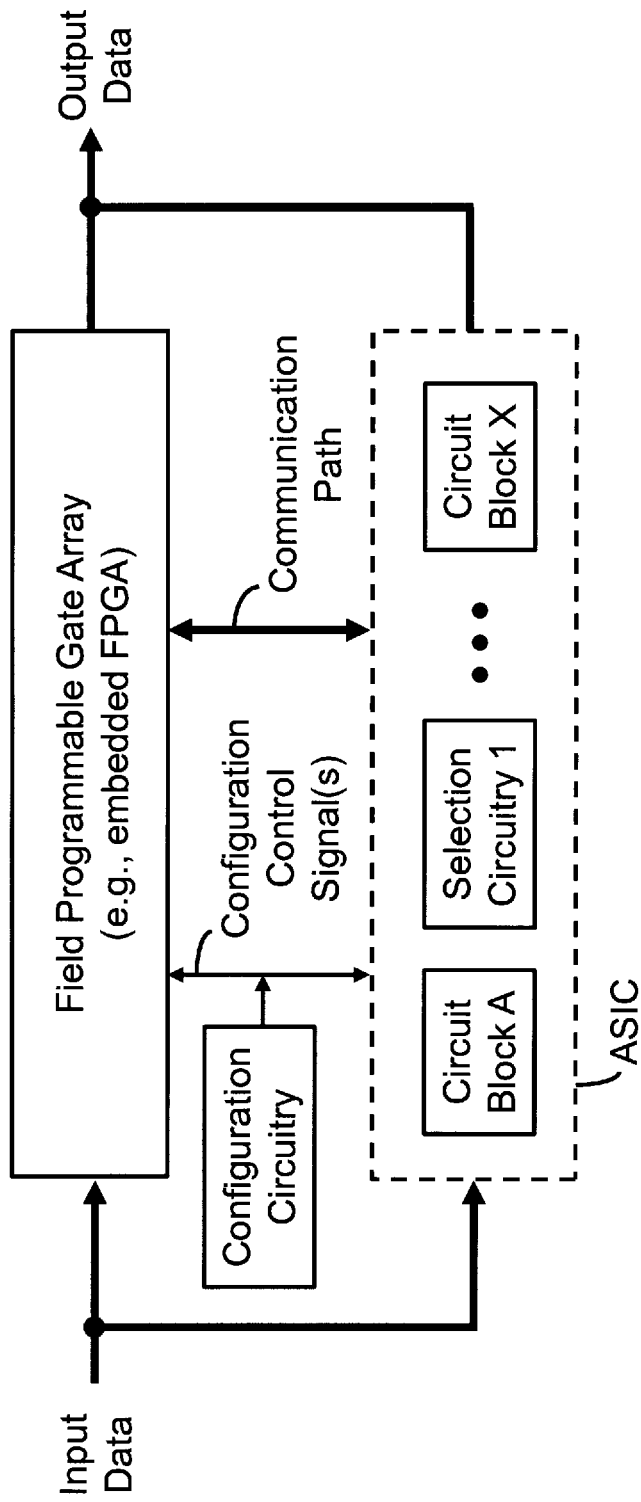
Figure 3D:
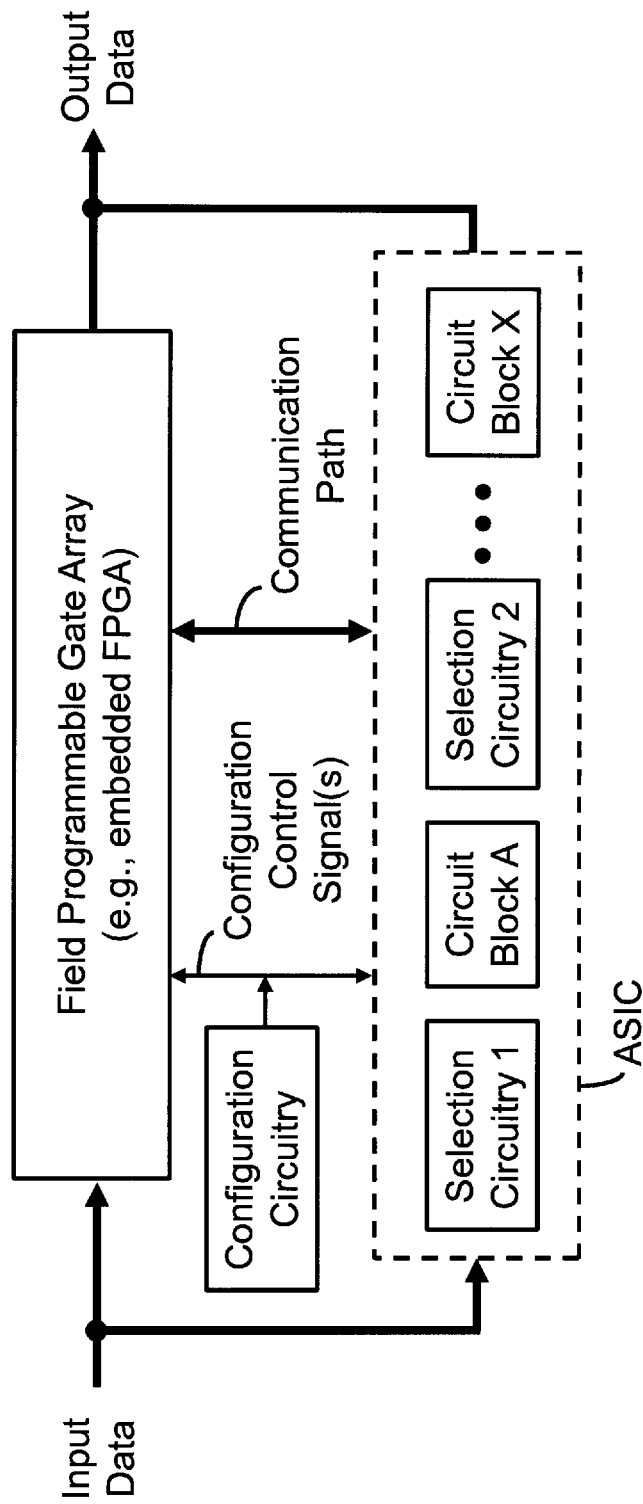

In one embodiment, the configuration circuitry controls or configures the interconnect network and connection thereof to one or more computing elements to incorporate or eliminate one or more data processing operation(s) or function(s) in/of the data path in the FPGA. In another embodiment, the configuration circuitry controls or configures the data flow between the FPGA and ASIC to control or configure the order, number and/or type of data processing operation(s) or function(s) in/of the data path in the ASIC (which, in one embodiment, includes circuitry which has a fixed or substantially fixed path of data processing). For example, with reference to FIGS. 2B, 3B and 3C, in one embodiment, selection circuitry is employed to incorporate or bypass one or more circuit blocks of the ASIC to thereby incorporate/add or remove/delete a type of processing operation(s) or function(s) in/of the path or pipeline of data processing of the ASIC. The circuit blocks of the ASIC may be designed to perform predetermined specific operation(s) or function(s) (e.g., circuit block A performs/implements operation A in connection with data input thereto, circuit block X performs/implements operation X in connect with data input thereto, etc.). In one embodiment, circuitry selection circuitry (e.g., one or more multiplexers) is disposed at the output of an associated circuit block (See FIG. 3C and circuit block A and selection circuitry 1). In another embodiment the circuitry selection is disposed at the input of a circuit block to control whether to incorporate/add or remove/delete the circuit block of the ASIC. (See FIG. 3D and circuit block A and selection circuitry 1). In yet another embodiment, the circuitry selection is disposed at the input and the output of an associated circuit block. (See FIG. 3D and circuit block A, selection circuitry 1 and selection circuitry 2).

Figure 4A:
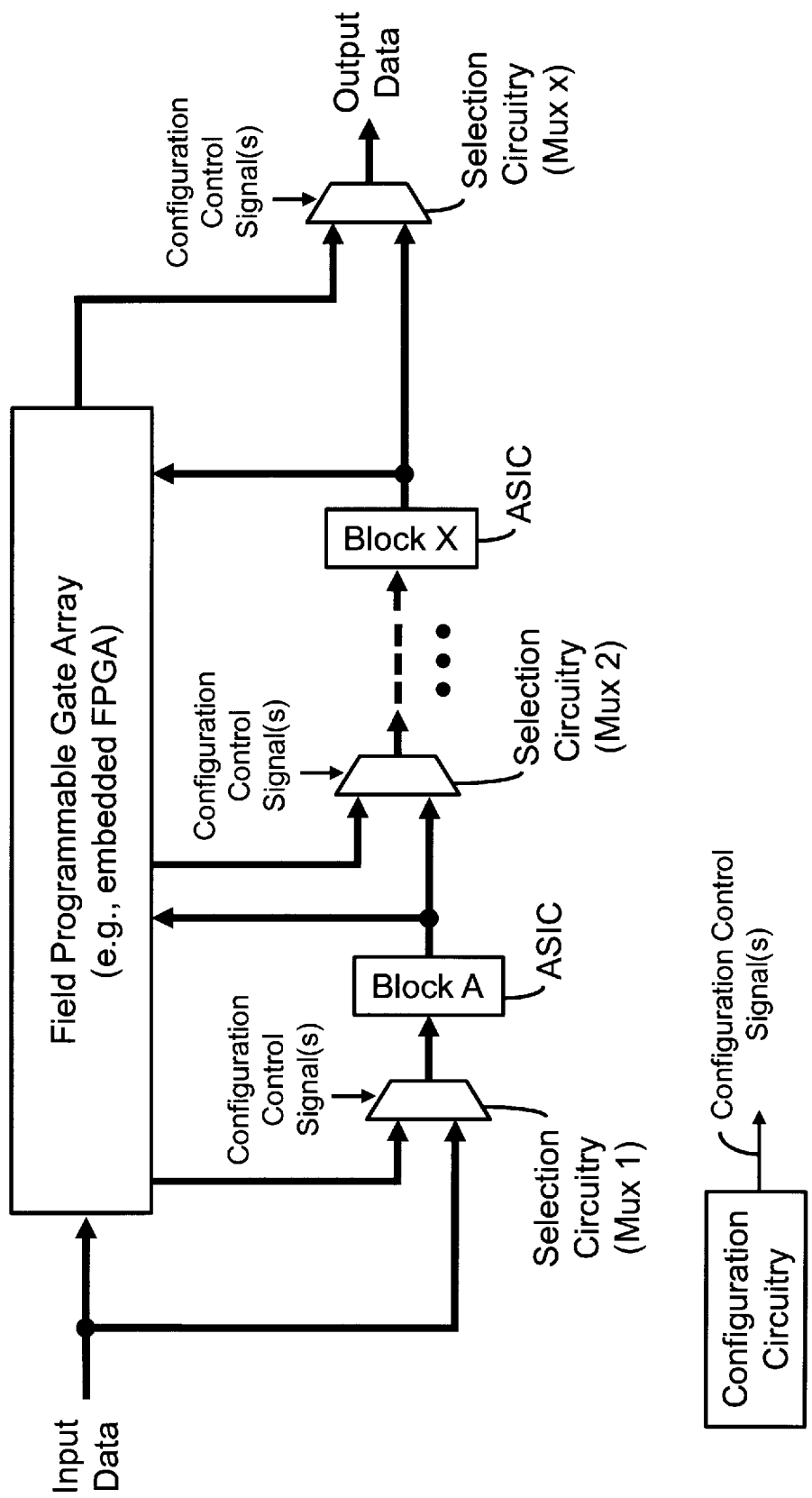

With reference to FIG. 4A, in one embodiment, the reconfigurable data processing path or pipeline includes selection circuitry including a plurality of multiplexers associated with one or more circuit blocks that receive data and perform a predetermined operation or function thereon. The configuration circuitry outputs configuration control signals that are applied to the multiplexers to configure and/or re-configure the type of data processing operation(s) or function(s) implemented in the processing path or pipeline of the data. Here again, the path or pipeline may be configured or re-configured in situ and/or at or during power-up, start-up, initialization, re-initialization or the like.

With continued reference to FIG. 4A, the data input to Circuit Block A ("Block A") of the ASIC is determined by MUX 1 of the selection circuitry. After the data undergoes the operation of Circuit Block A, the data is provided to the FPGA as well as the next circuit block. The MUX 2 of the selection circuitry determines whether the next circuit block receives the output of Circuit Block A or data from the FPGA. In this regard, the data from the FPGA may processed according to operations or functions performed in the FPGA before being output to MUX 2. Thus, in this embodiment, the configuration circuitry is employed to define, program or configure selection circuitry (e.g., multiplexers) to establish, program, re-program, define, re-define, configure and/or re-configure an order, a number and/or a type of processing operation(s), function(s) and/or path(s) of one some or all of the data in the FPGA and/or the ASIC. That is, the configuration circuitry is programmable, configurable and/or reconfigurable to define or configure the order, number and/or type of data processing operation(s) and/or function(s)) implemented in the data processing path in/of the FPGA and/or the ASIC.

Notably, with reference to FIG. 4A, the output of Circuit Block A may be input into the FPGA and applied to one or more computing elements (i.e., logic circuitry that implements one or more data processing operations/functions) via the switch interconnect network of the FPGA. After such processing, the data is output to MUX 2 via properly configuring the switch interconnect network of the FPGA. The MUX 2, in response to configuration control signals, applies either the data output from Circuit Block A or the data output from the FPGA, or both (e.g., sequentially). The next circuit block then performs the predetermined operation or function of that circuit block on the data input thereto. The process continues through the ASIC and/or FPGA according to the configured or re-configured data processing path or pipeline.

Figure 4C:
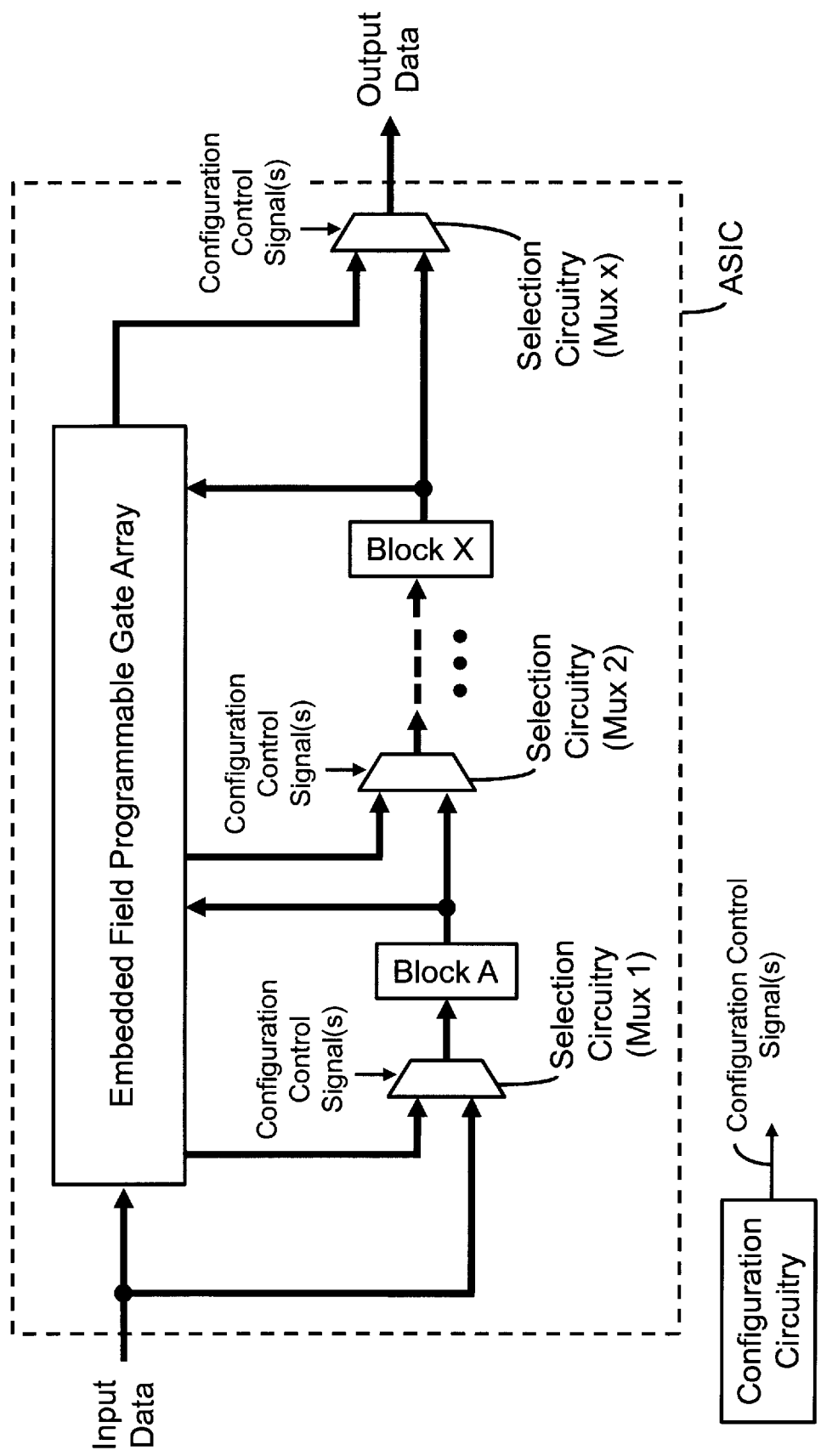

As noted above, whether or not illustrated, some or all of the selection circuitry may be disposed in the ASIC (see, e.g., FIGS. 4B and 4C), the FPGA and/or separate from each; all combinations and permutations are intended to fall within the scope of the present inventions.

Figure 5A:
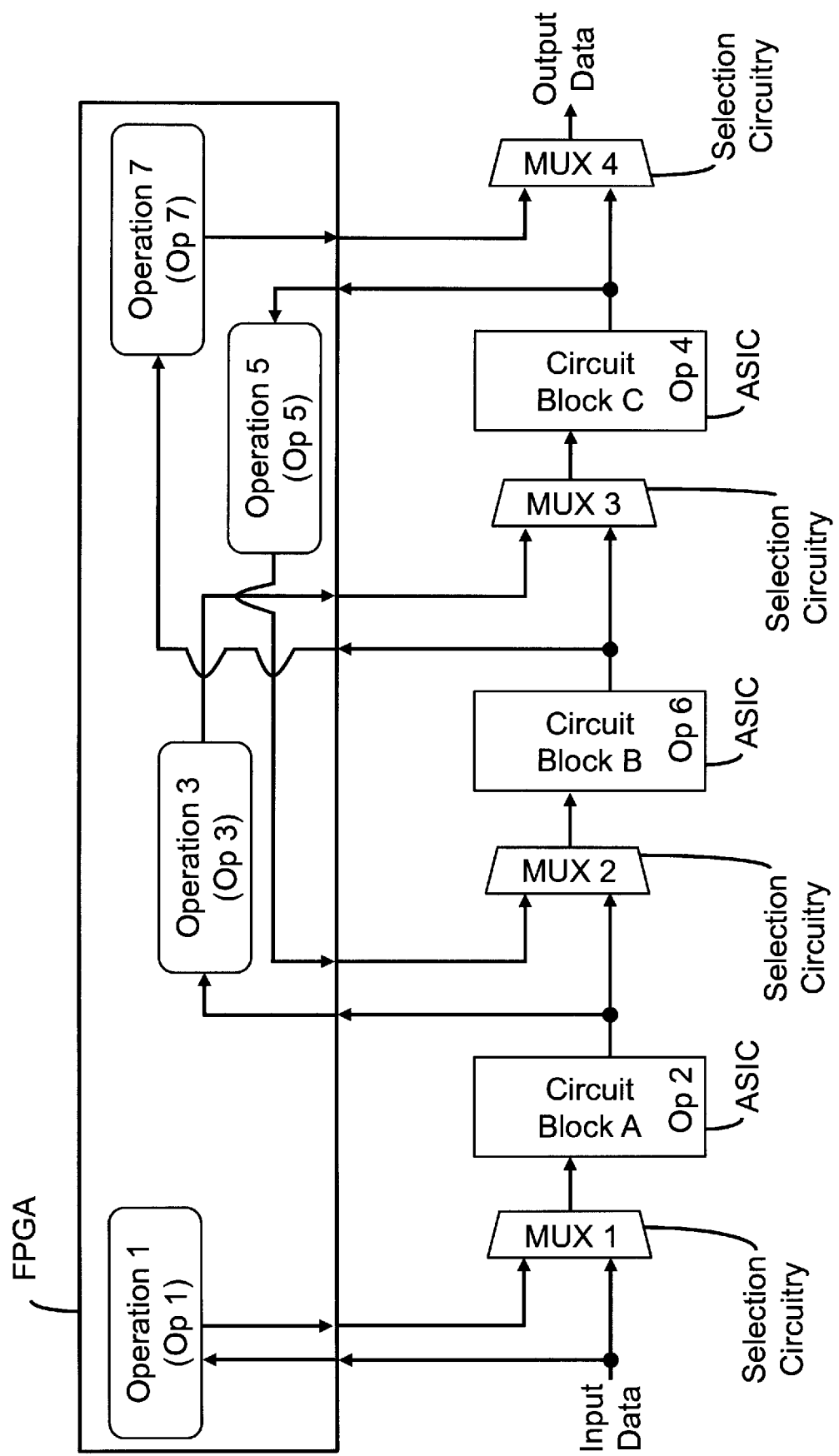
FIGS. 5A-5F illustrate, in block diagram form, exemplary reconfigurable data pipelines of an FPGA, including logic circuitry to perform a plurality of operations, selection circuitry, and ASIC architecture including a plurality of circuit blocks, each performing one or more associated predetermined operations or functions on the data applied thereto, according to one or more aspects of the present inventions, wherein the FPGA includes an interconnect network to facilitate or provide configuration or control of the order, number and/or type of data processing operation(s) or function(s) in/of the data path in the FPGA (via configuration of the interconnect network and connection thereof to one or more computing elements); notably, the one or more circuit blocks of the ASIC perform predetermined process(es), operation(s) or function(s) (e.g., digital signal processing, encoding, decoding, encrypting, decrypting and/or filtering) and selection circuitry responsively provides configurable or controllable data flow within the ASIC and/or between the FPGA and the ASIC which facilities configuration or control of the order, number and/or type of data processing operation(s) or function(s) in/of the data path in the FPGA and/or the ASIC; the order, number and type of the operations implemented/incorporated in the processing path may be changed (at any time—e.g., in situ) because of the reconfigurable nature of the FPGA and the MUX blocks (notably, each MUX block may be a plurality or bank of multiplexers) as illustrated in the exemplary embodiments in FIGS. 5A-5F; again, the selection circuitry may be separate from the FPGA and ASIC (see FIG. 5A), partially or fully in the FPGA, or partially or fully in the ASIC (see FIG. 5B); moreover, the data output by the exemplary reconfigurable data pipelines may the FPGA and/or the ASIC.
Figure 5B:
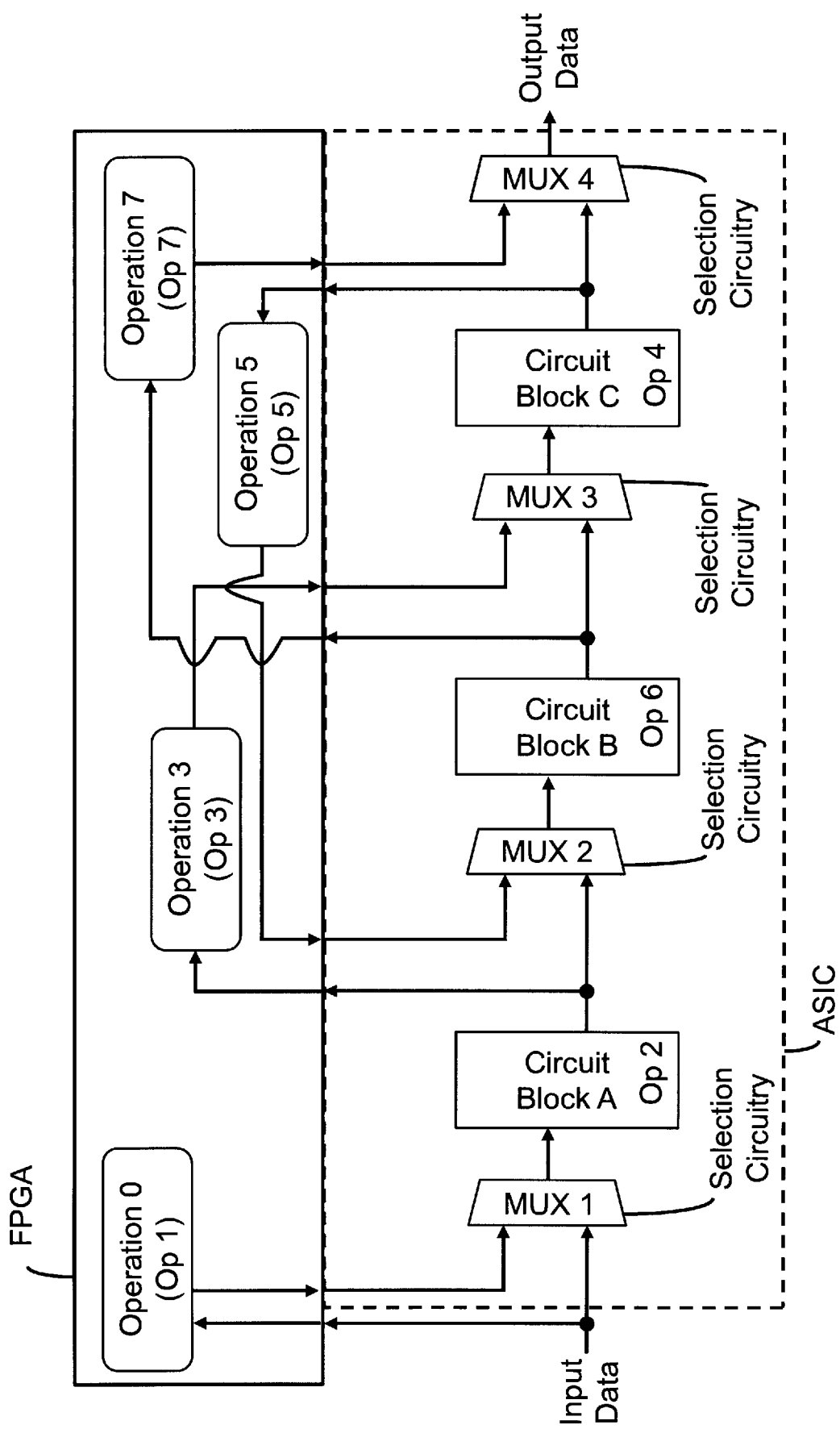

With reference to FIGS. 5A and 5B, in one embodiment, the data processing path includes a plurality of data processing operation(s) and/or function(s)) implemented in the FPGA (e.g., embedded FPGA) and/or the ASIC. The configuration circuitry is programmable, configurable and/or reconfigurable to define or configure the order, number and/or type of data processing operation(s) and/or function(s)) implemented in the data processing path. Here, the input data is provided to the FPGA wherein logic circuitry therein performs Operation 1 on some or all of the input data. In addition, the input data is provided to MUX 1 which responsively controls the input into Circuit Block A of the ASIC. As such, Circuit Block A performs Operation 2 (Op2) on the data applied thereto. The data applied to Circuit Block A may be the input data or the processed data from the FPGA (i.e., the input data which underwent processing via Operation 1), or both. That is, the configuration circuitry may control MUX 1 to provide only the input data (or a portion thereof) to Circuit Block A, only the processed data from the FPGA, or both such data (or a portion thereof).

The selection circuitry, in one embodiment, may be employed to select as well as combine data of different data paths or pipelines. For example, with reference to FIG. 5A, selection circuitry MUX 3 may be controlled to provide processed data to Circuit Block C from the FPGA (processed via Operation 3) and/or from Circuit Block B (processed via Operation 6) of the ASIC. The Circuit Block C receives the data and performs Operation 4. Where the Circuit Block C processes both sets of data (via controlling selection circuitry MUX 3), the processing of the data may be sequentially provided to Circuit Block C, multiplexed, etc. Moreover, selection circuitry may provide all of the data from the previous operation or less than all of the data. That is, the data path or pipeline may also discard, limit or partially process certain data prior to transferring the data to a subsequent operation or function to be performed by a circuit block in the ASIC or logic circuitry in the FPGA. Notably, one or more or all of the inventions described and illustrated in Application Ser. No. 62/748,750, entitled "FPGA Implementing Partial Datapath Processing, and Method of Operating Same" may be incorporated with one or more or all of the inventions described and illustrated herein. Application Ser. No. 62/748,750 is incorporated by reference and, for the sake of brevity, the combination of inventions are not illustrated individually in detail herein.

The configuration circuitry controls the selection circuitry which defines or configures the order, number and/or type of data processing operation(s) and/or function(s)) implemented in the data processing path in/of the FPGA and/or the ASIC; all combinations and permutations of such processing operations and/or functions are intended to fall within the scope of the present inventions.

Figure 5C:
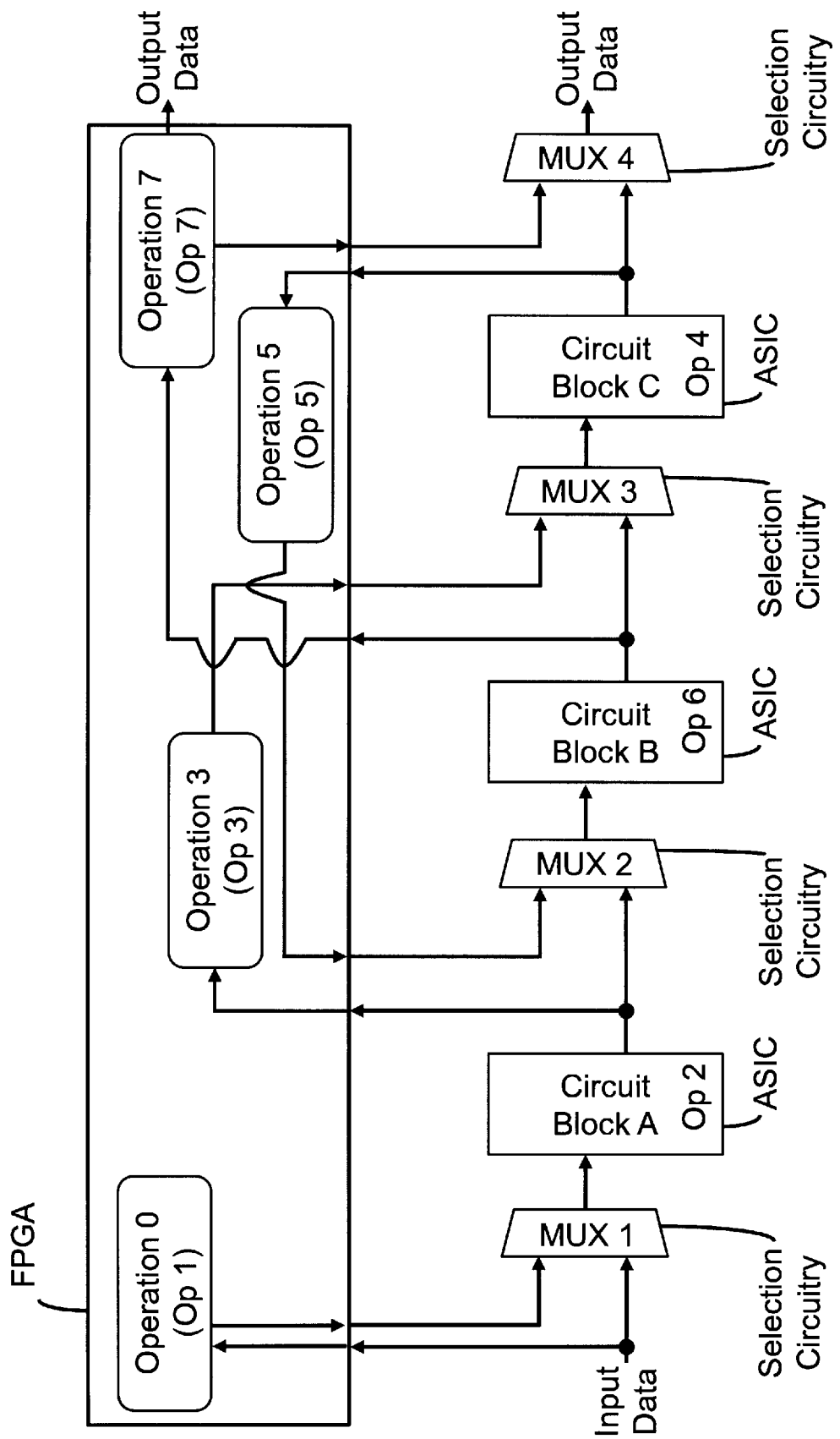
Figure 5D:
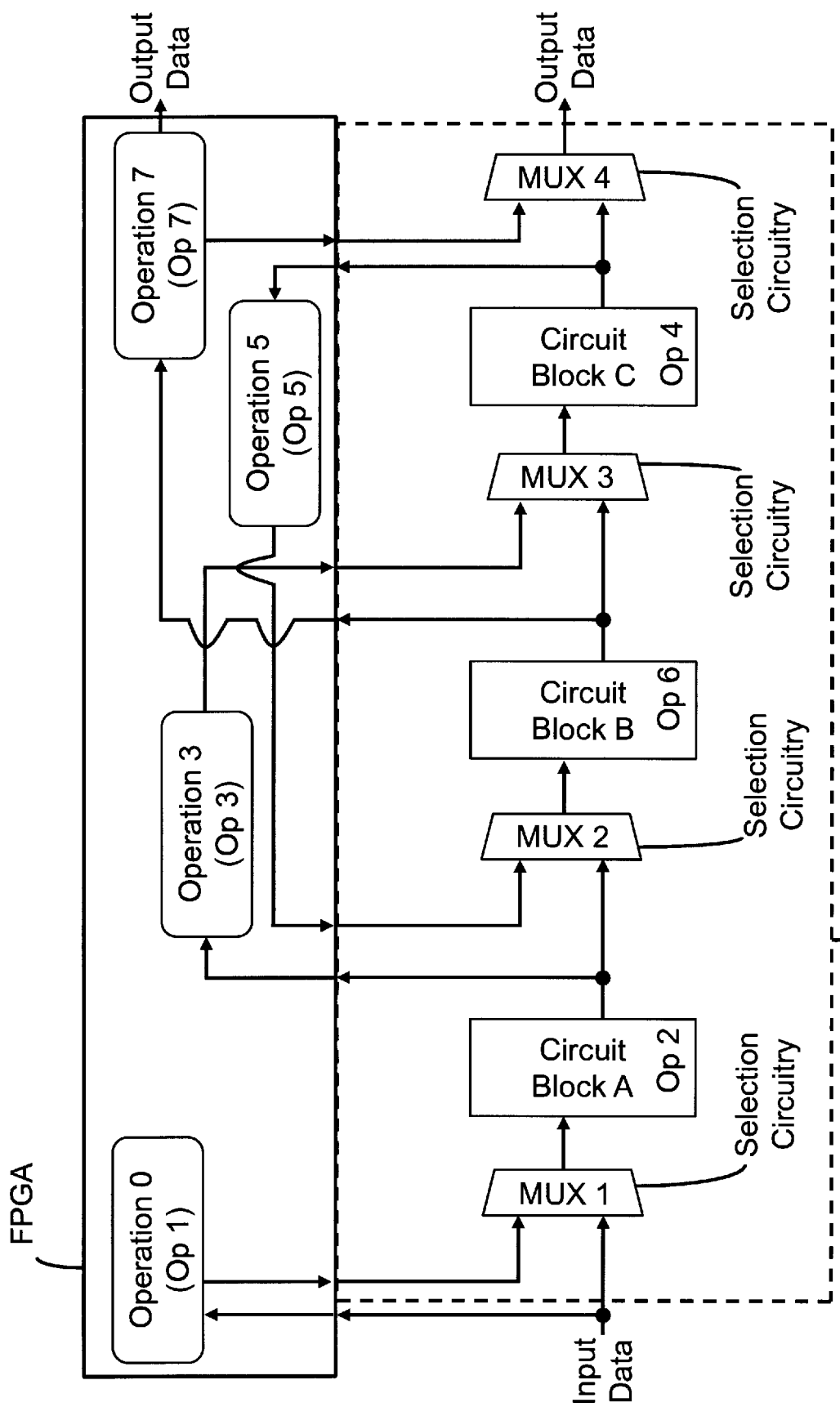
Figure 5E:
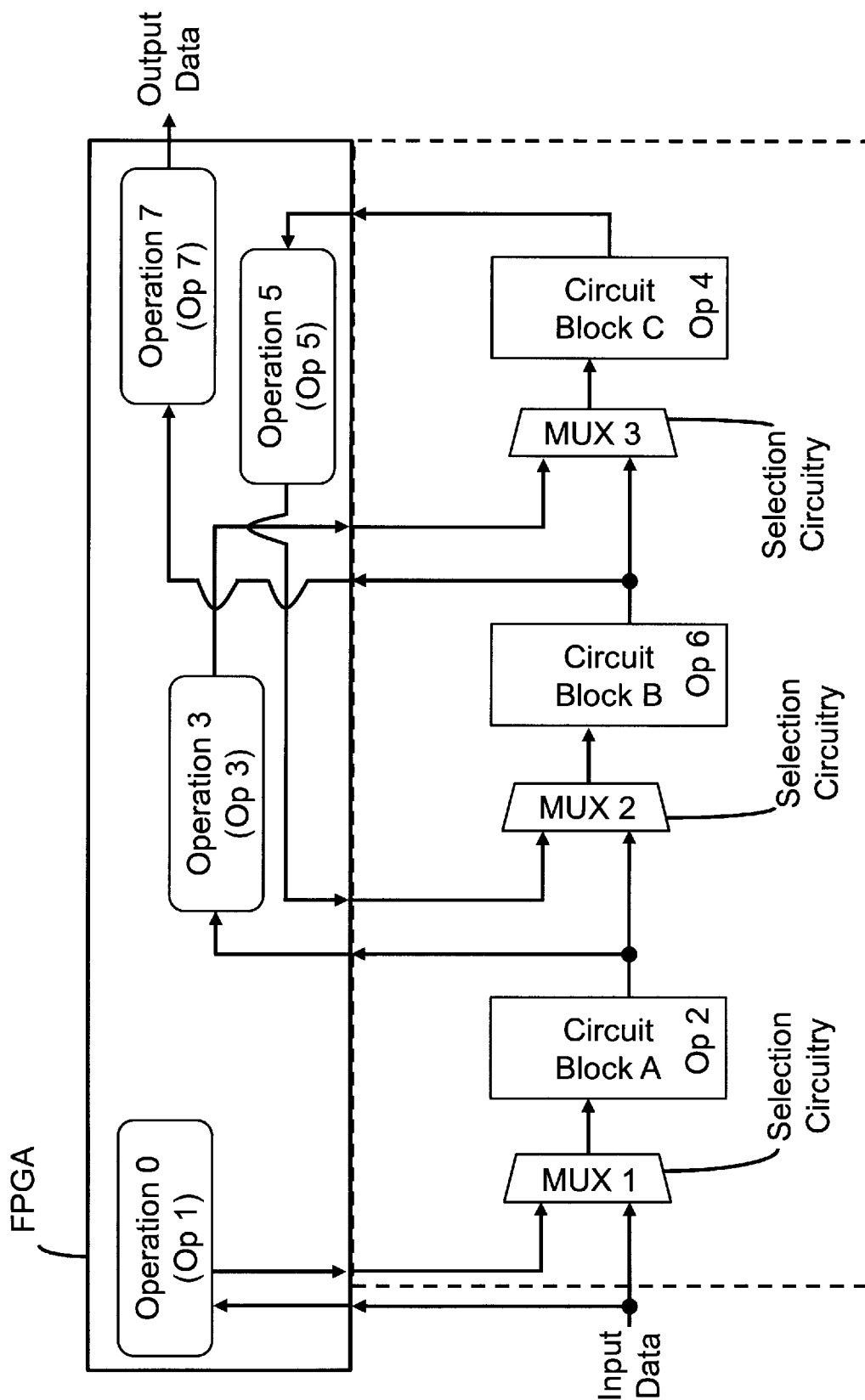
Figure 5F:
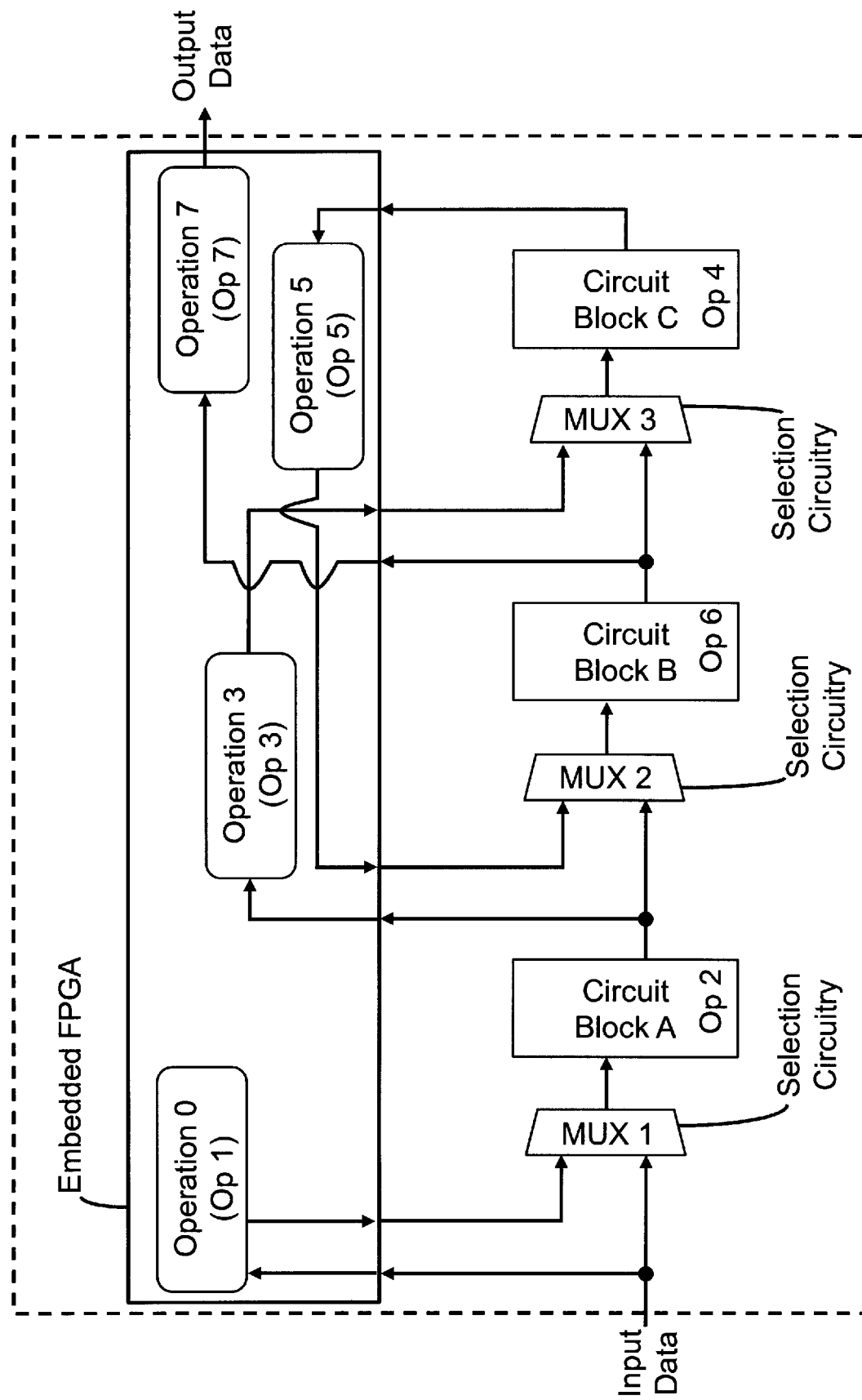

The output of the data processing path(s) or pipeline(s) may be from the FPGA and/or the ASIC. For example, with reference to FIGS. 5C and 5D, in one embodiment, a first data processing path or pipeline may be output from the ASIC via MUX 4 and a second data processing path or pipeline may be output from the FPGA. Notably, the first data processing path or pipeline may or may not include data processing operation or function labeled Operation 7 in/of the data path in the FPGA. That is, the output data of the ASIC may be data from Circuit Block C (after the operation implemented by Circuit Block C (i.e., Operation 4)) and/or the processed data (Operation 7) from the FPGA. The second data processing path or pipeline may be output from the FPGA after the Operation 7 implemented by FPGA.

With continued reference to FIGS. 5A-5F, in one exemplary embodiment, for example, Input Data is processed in the ASIC by Circuit Block A, Circuit Block B, Circuit Block C and then to Output Data. In this embodiment, the FPGA element may be present but it is not incorporated or implemented in the data processing path).

In another exemplary embodiment, Input Data is input into the FPGA wherein circuitry therein performs or processes such data according to Operation 1. The output is then applied or provided to Circuit Block A of the ASIC. The data output from Circuit Bock A is applied or provided to FPGA wherein circuitry therein performs or processes such data according to Operation 3. The output of the FPGA (i.e., the data processed via Operation 3) is then applied or provided to Circuit Block C which processes the data according to Operation 4. The output of Circuit Bock C is then applied or provided to FPGA wherein circuitry therein performs Operation 5. Thereafter, the output of the FPGA (i.e., the data processed via Operation 5) is then applied or provided to Circuit Block B which performs Operation 6. The output of Circuit Bock B is then applied or provided to FPGA wherein circuitry therein performs or processes such data according to Operation 7, thereafter the output of the FPGA (i.e., the data processed via Operation 7) is output as Output Data (see, e.g., FIG. 5A).

Notably, the present inventions may use one, some or all of the circuit blocks of the ASIC as well as any number of FPGA Blocks (which implement operations). Moreover, the order of the ASIC and FPGA Blocks may be changed to any order, including, for example, implementing a data path through ASIC Circuit Block C before the data is applied to ASIC Circuit Block B. Indeed, in one exemplary embodiment, Input Data may be applied or provided to Circuit Block A which is processed according to Operation 2, and that processed data is applied to FPGA (wherein the circuitry thereof implements Operation x), the output of the FPGA (i.e., the data processed via Operation 5) is then applied or provided to Circuit Block C which performs Operation 4; thereafter the output of the Circuit Block C (i.e., the data processed via Operation 4) is output via MUX 4 as Output Data. Here, only a partial set of ASIC Circuit Blocks are employed, incorporated or implement in the data processing path In addition, in one embodiment, the processing path includes only one or more operations implemented by circuitry in the FPGA. For example, Input Data is applied or provided to the FPGA where circuitry therein processes such data via one or more circuit blocks (implementing one or more operations). After such processing, the processed data is output as Output Data (e.g., via MUX 4 (see FIGS. 5A and 5B) and/or directly (see FIGS. 5C-5F)).

Notably, the data processing path(s) or pipeline(s) illustrated in FIGS. 5A-5F and the exemplary data processing path(s) or pipeline(s) described immediately above are merely exemplary to illustrate/describe certain features of the present inventions. For the avoidance of doubt, the inventions are not limited to data processing path(s) or pipeline(s) illustrated/described herein; indeed, such data processing path(s) or pipeline(s) are merely exemplary.

Figure 6A:
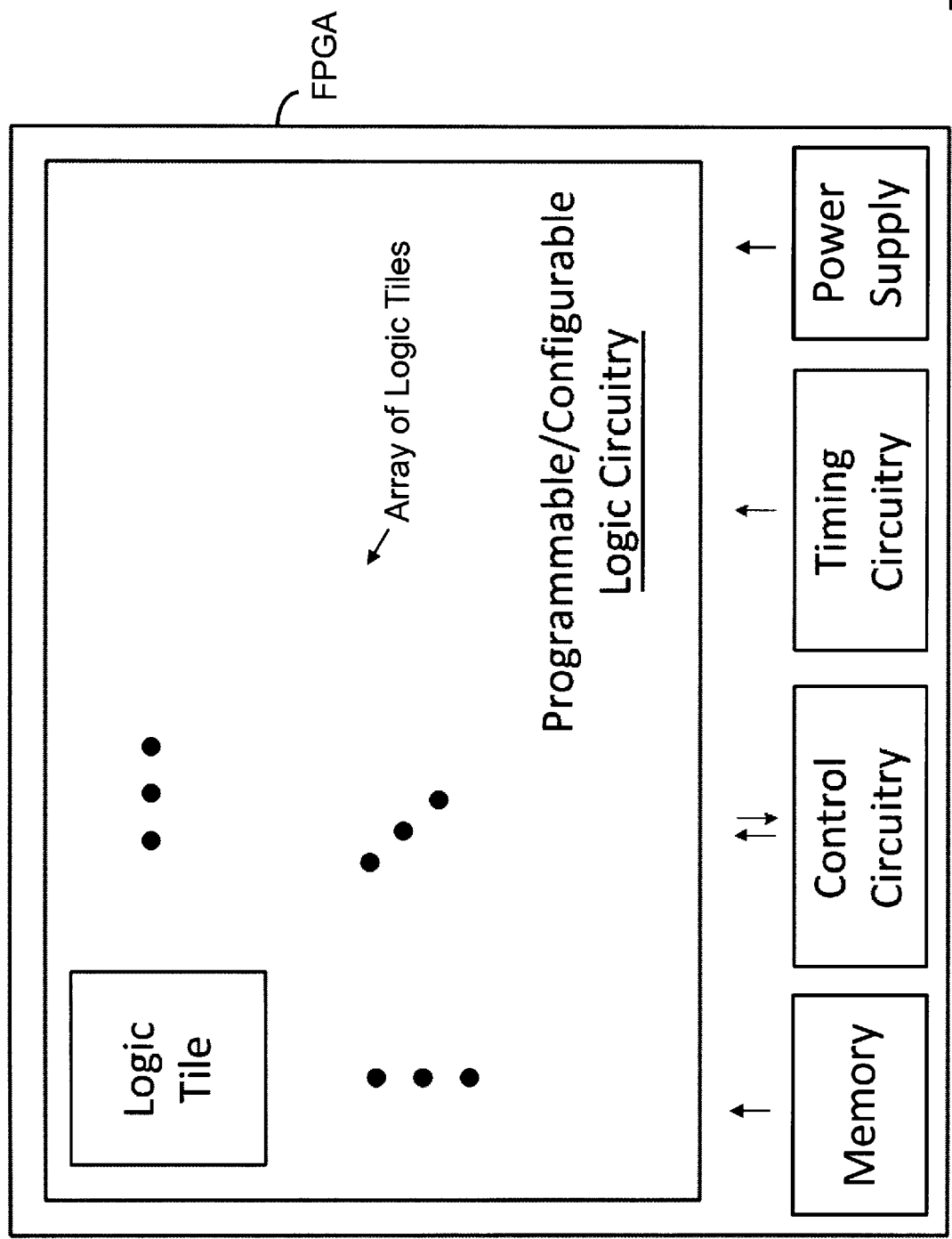
FIG. 6A illustrates a block diagram representation of, for example, an exemplary FPGA portion of the integrated circuit including control circuitry, timing or clock circuitry, power supply circuitry and programmable/configurable logic circuitry (which, in one embodiment, includes a plurality of logic tiles, each of which may include transistors configured to perform combinational and/or sequential functions (simple and/or complex) and transistors (that may be interconnected, for example, as multiplexers having two or more inputs which are electrically interconnected into a network (see, e.g., the interconnect networks described and/or illustrated in U.S. Pat. No. 9,503,092, which are incorporated herein by reference) as well as connected to, for example, associated data storage elements, input pins and/or lookup tables that, when programmed, determine the operation of the multiplexers))
Figure 6B:
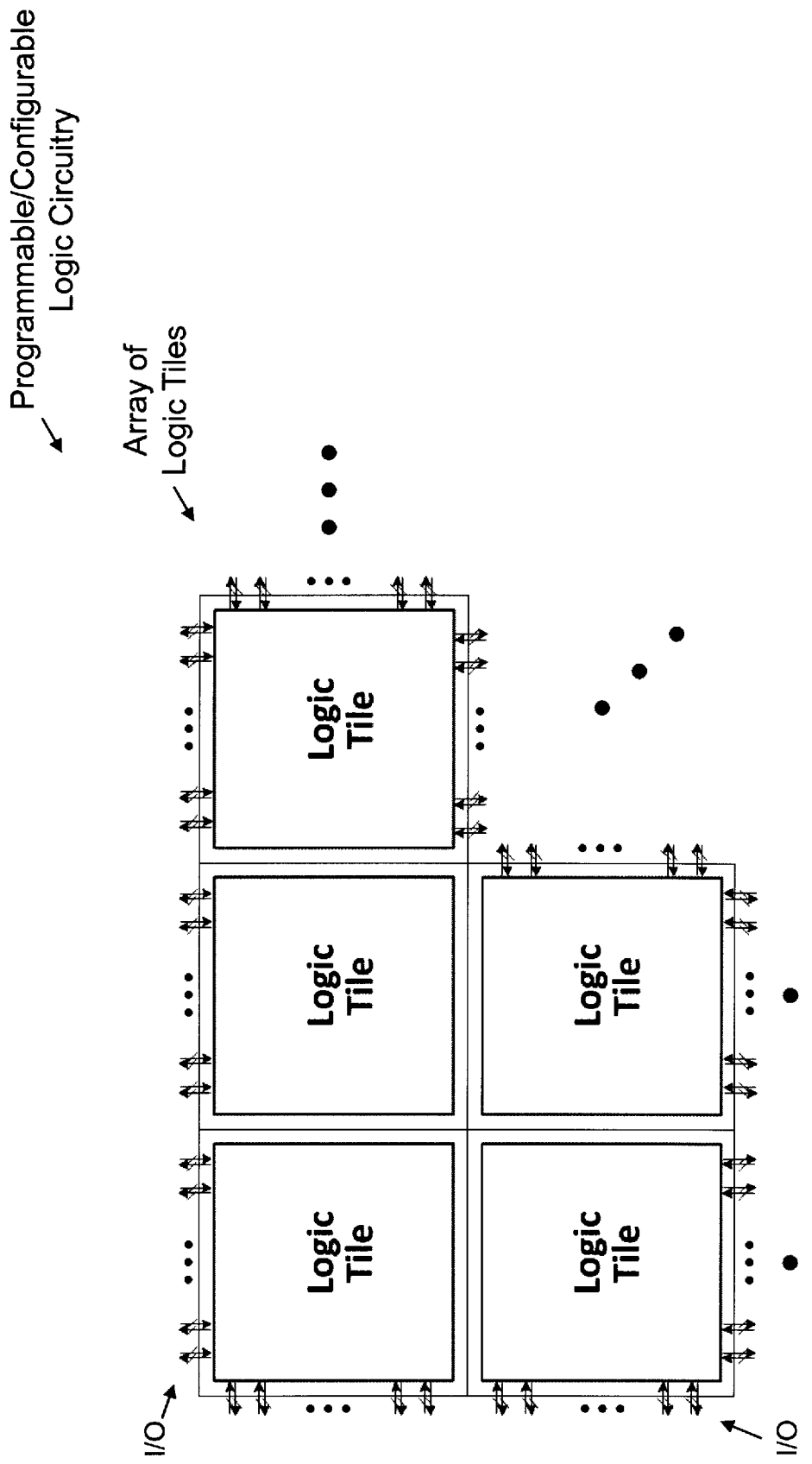
FIG. 6B illustrates, among other things, a block diagram representation of an array of a plurality of logic tiles of, for example, an exemplary FPGA, wherein input/output of the logic tiles may facilitate communication between the logic tiles and/or between certain logic tiles and circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (e.g., a hierarchical network and/or mesh network); notably, in these illustrative embodiments, electrical power may be provided to the array of logic tiles via a power supply and/or through power-on/power-off circuitry that is maintained, programmable or configurable via one or more control signals from, for example, the control circuitry; in one embodiment, such power-on/power-off circuitry may be located in the logic tile, at the electrical power interface therewith, and/or adjacent to one or more primary power supplies which provide power to the array of logic tiles.
Figure 6C:
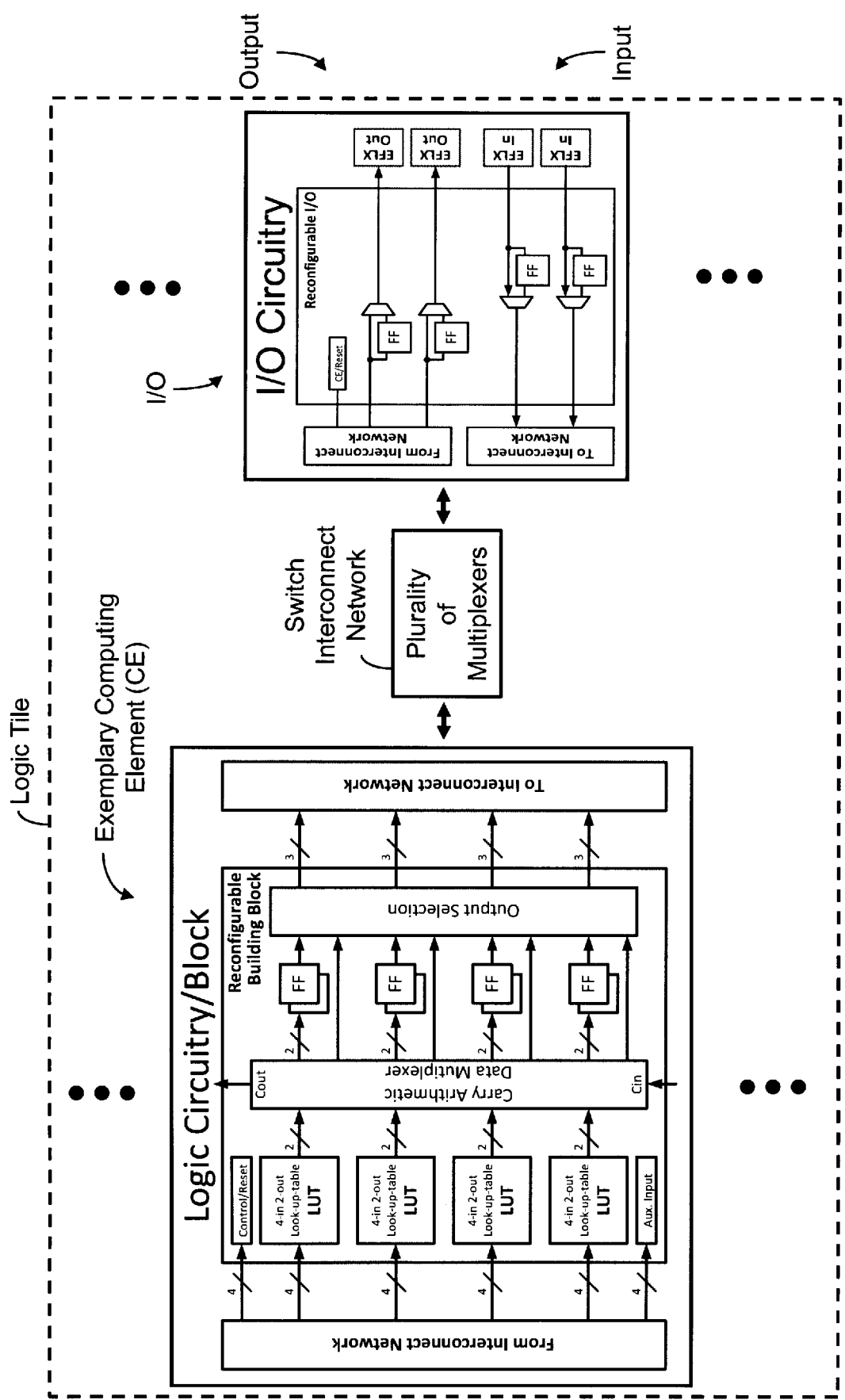
FIG. 6C illustrates a block diagram representation of a portion of an exemplary logic tile of the programmable/ configurable logic circuitry of FIGS. 6A and 6B, wherein the logic tile includes logic and I/O, for example, a plurality of (i) logic blocks, each logic block including, for example, a plurality of look-up-tables, arithmetic blocks, data multiplexers, flip-flops, and control/reset circuitries, (ii) I/O (I/O circuitry or blocks, which are disposed on the periphery, perimeter or edge of the logic tile, to facilitate interconnection between circuitry of the logic tile and circuitry external to the tile (and, in one embodiment, external to the logic tile array of the programmable/configurable logic) and (iii) an interconnect network including one or more multiplexers or switches which may be arranged or configured into an interconnect network having a plurality of switch matrices (or stages of switch matrices) to, for example, facilitate communication between the logic tiles and/or performance of logic operation in or during normal operation of the currently configured integrated circuit (e.g., the interconnect networks described and/or illustrated in U.S. Pat. No. 9,503,092, which are incorporated herein by reference)

The FPGA may be any architecture now known or later developed—all of which are intended to fall within the scope of the present inventions. In one embodiment, the FPGA includes a plurality of logic tiles. For example, with reference to FIGS. 6A-6C, in one embodiment, the FPGA includes, among other things, programmable/configurable logic circuitry which includes a plurality of logic tiles (e.g., arranged in an array of row(s) and column(s) wherein one or more (or all) of the logic tiles are configurable to a powered-up state or a powered-down state. Each logic tile typically includes thousands of transistors which may be configured to perform combinational and/or sequential functions (simple and/or complex). In one embodiment, each logic tile may include one or more multiplexers or switches which may be arranged in a plurality of switch matrix or switch matrices stages of an interconnect network, to, for example, connect to logic circuitry which performs logic operations or functions in or during normal operation of the integrated circuit (based on that current configuration of the logic block(s)) and (ii) I/O (I/O pins and associated I/O circuitry or blocks)—for example, I/O pins, disposed on the periphery, perimeter or edge of the logic tile, and I/O circuitry or blocks associated with such I/O pins, to facilitate interconnection between circuitry of the logic tile and circuitry external to the programmable/configurable logic circuitry. (See, e.g., FIG. 6C). In one embodiment, interconnect network includes multiplexer(s) wherein look-up tables (LUTs) may, in one embodiment, be employed to facilitate configuration of the interconnect network of the FPGA (e.g., U.S. Pat. No. 9,906,225) in the integrated circuit.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Figure 7A:
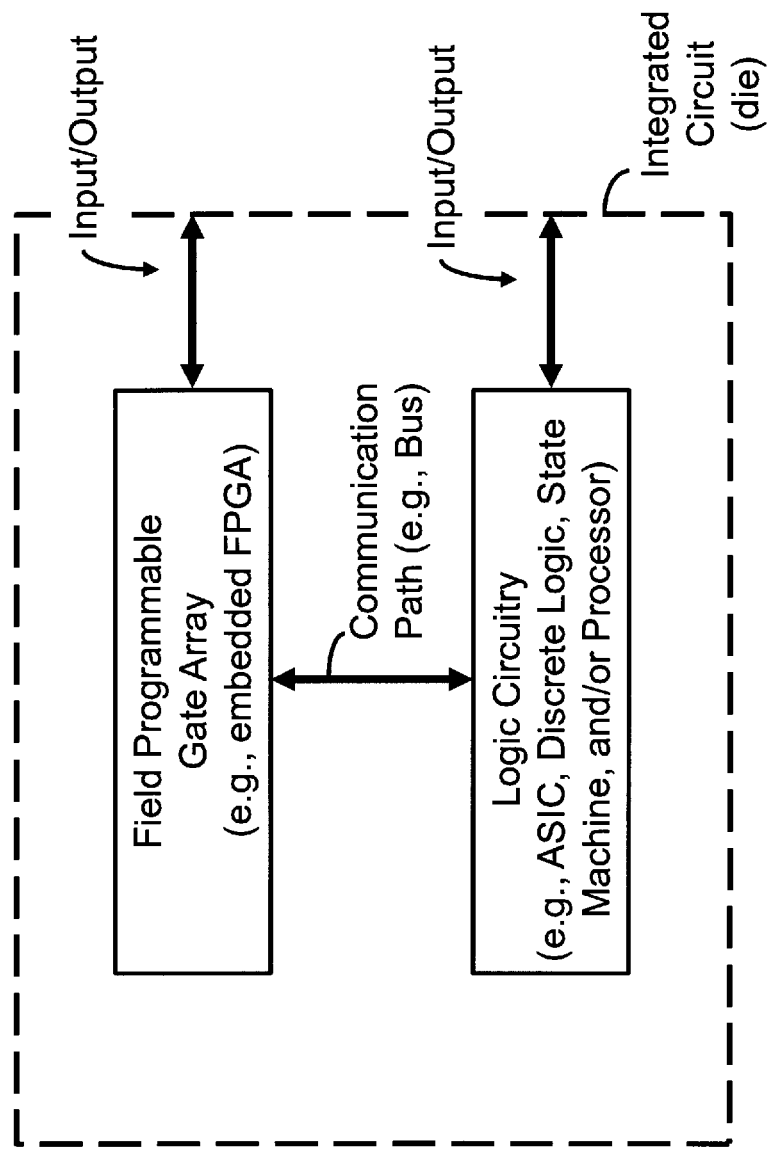
FIGS. 7A and 7B illustrate block diagram representations of exemplary integrated circuits including a field programmable gate array (e.g., an embedded FPGA) and logic circuitry (e.g., an ASIC), discrete logic, state machine and/or processor) according to one or more aspects of the present inventions wherein a bus may provide a communication path between the FPGA and the logic circuitry (as well as between circuitry external to the integrated circuit and the FPGA and/or the logic circuitry); notably, any communication configuration between the FPGA and logic circuitry (as well as between external circuitry and the FPGA and/or the logic circuitry) is intended to fall within the scope of the present inventions.
Figure 7B:
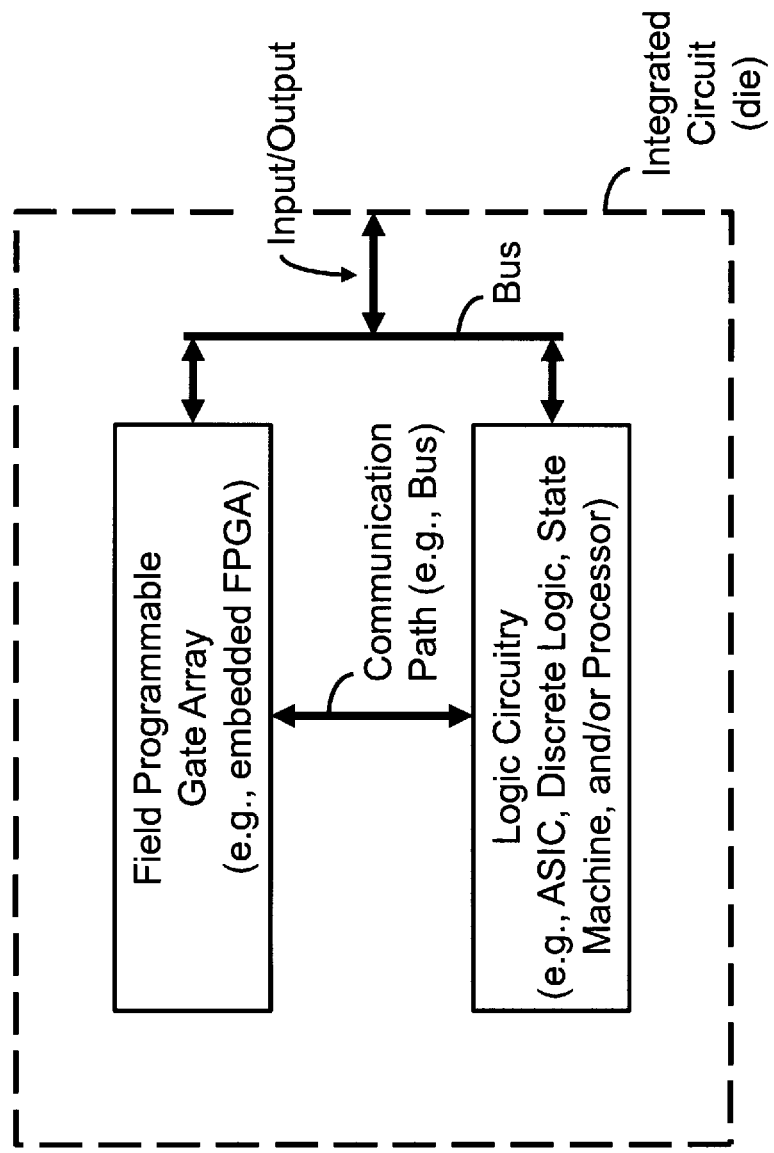
Figure 7C:
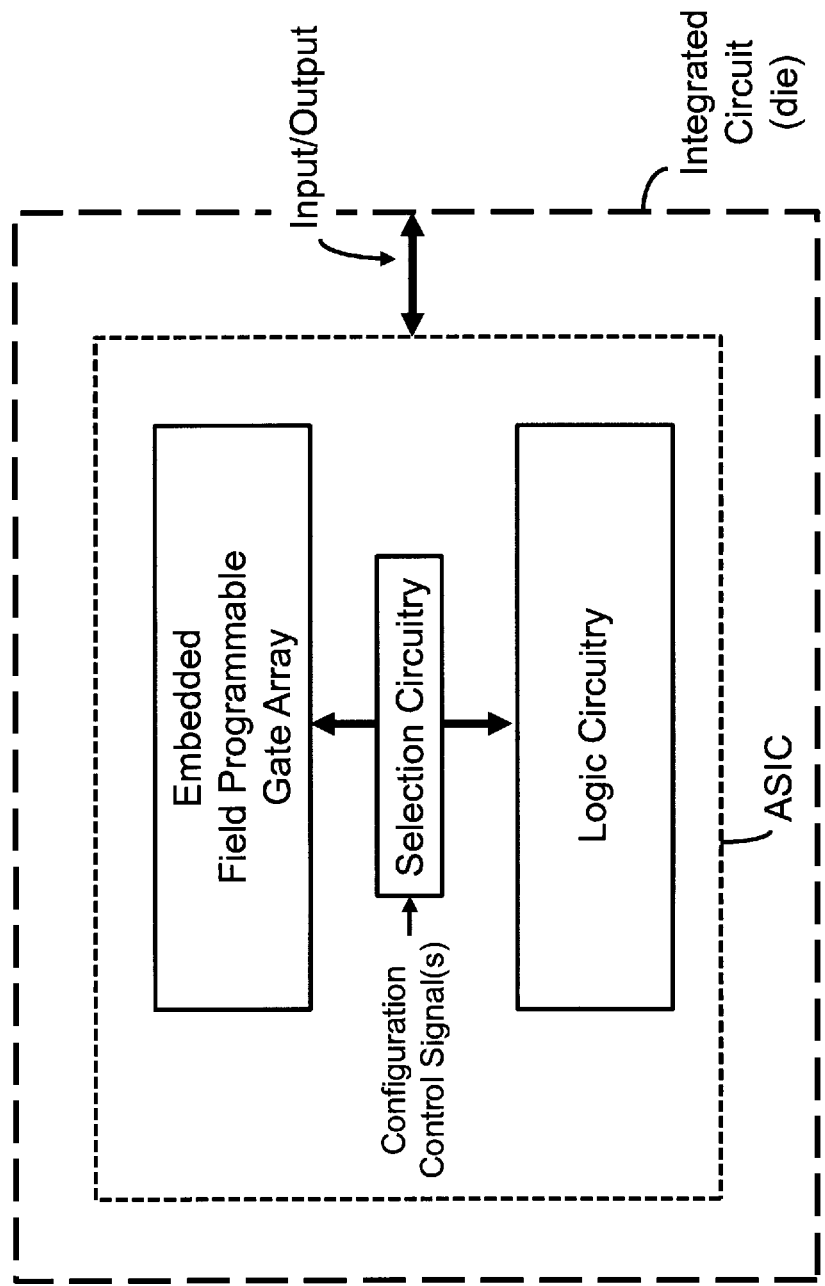
FIG. 7C illustrates a block diagram representation of exemplary integrated circuit including an ASIC and an embedded field programmable gate array (eFPGA) according to one or more aspects of the present inventions wherein a bus may provide a communication path between the eFPGA and the logic circuitry (as well as between circuitry external to the integrated circuit and the eFPGA and/or the logic circuitry); notably, any communication configuration between the eFPGA and logic circuitry (as well as between external circuitry and the eFPGA and/or the logic circuitry) is intended to fall within the scope of the present inventions.
Figure 8B:
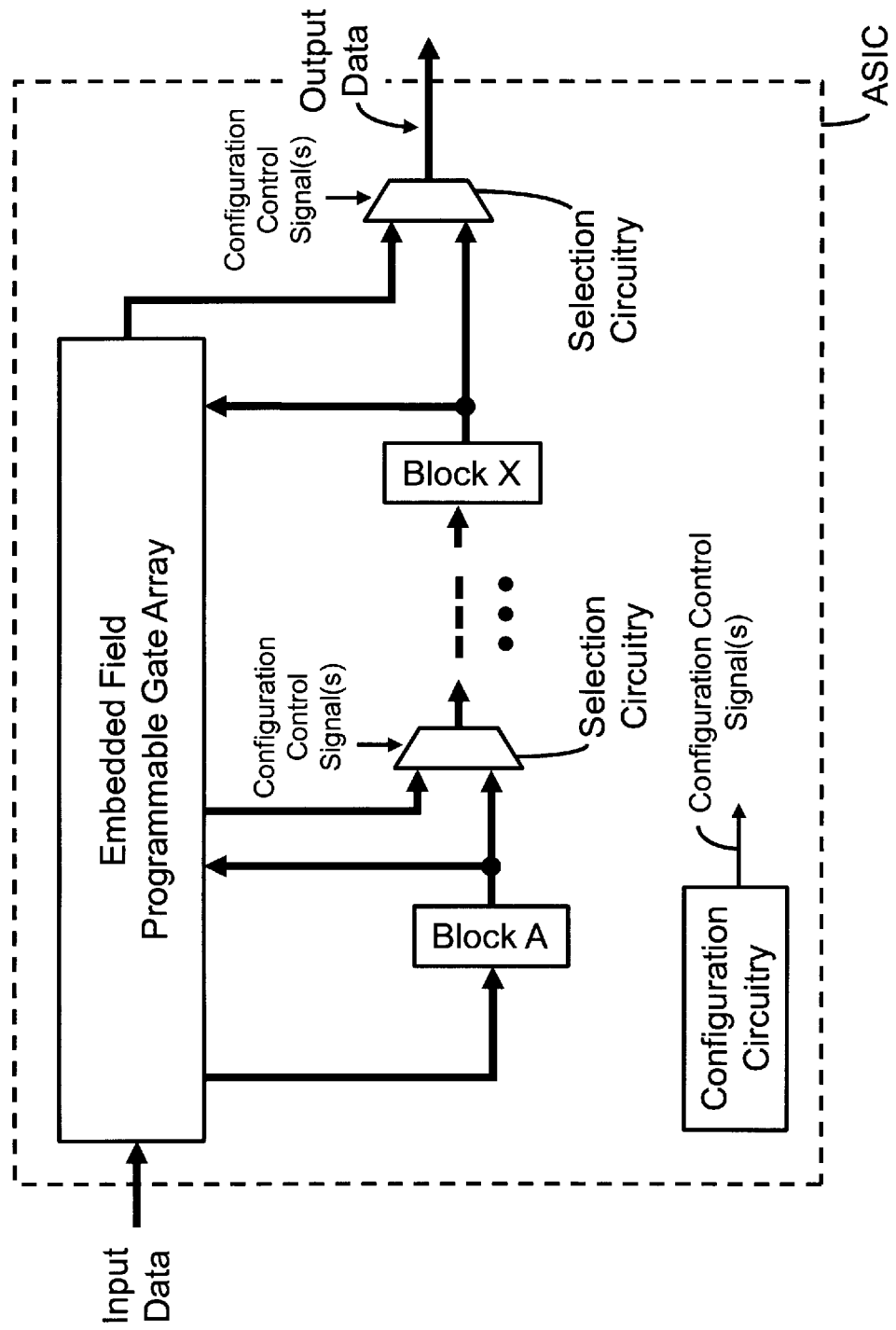
Figure 8C:
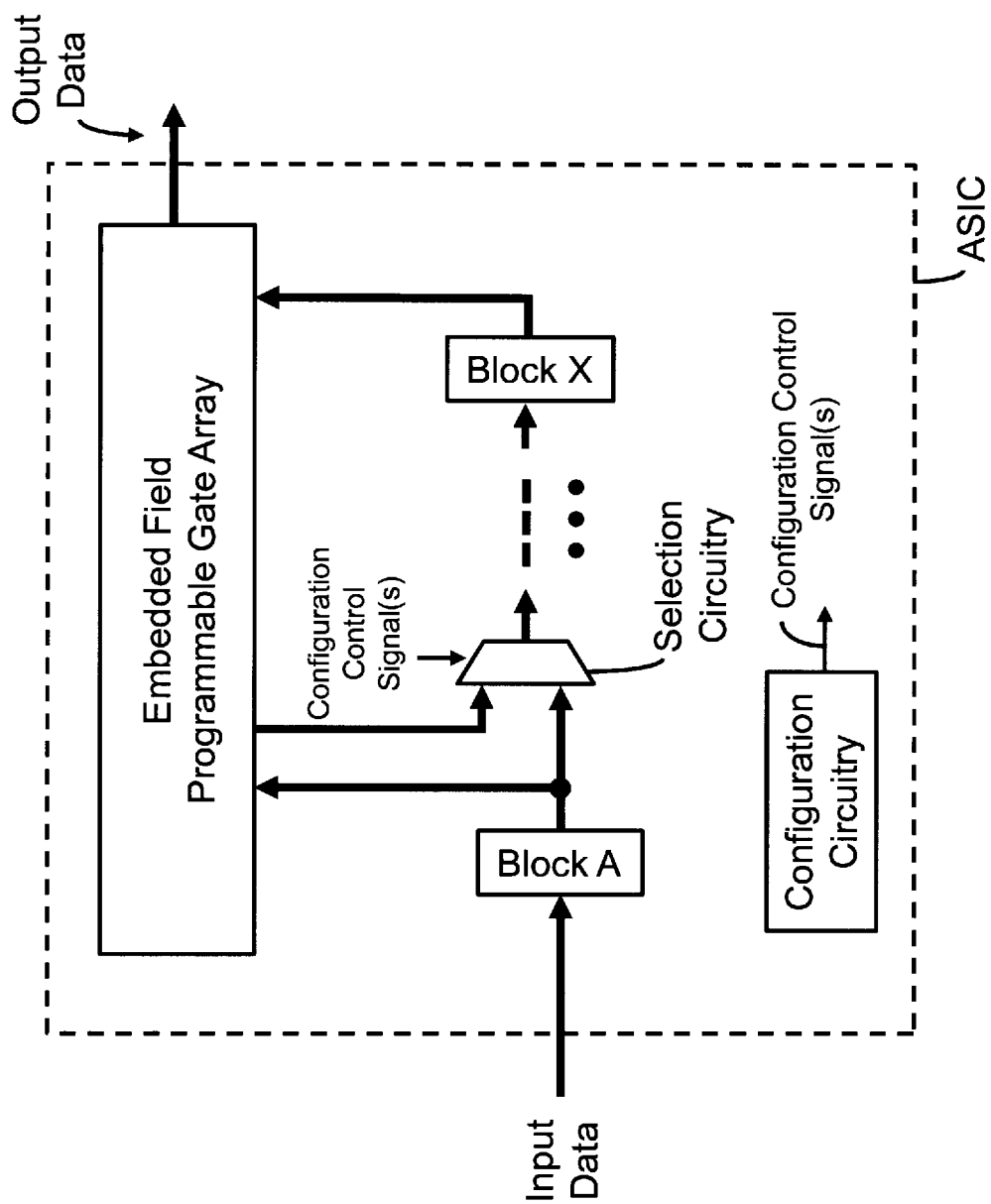
Figure 8D:
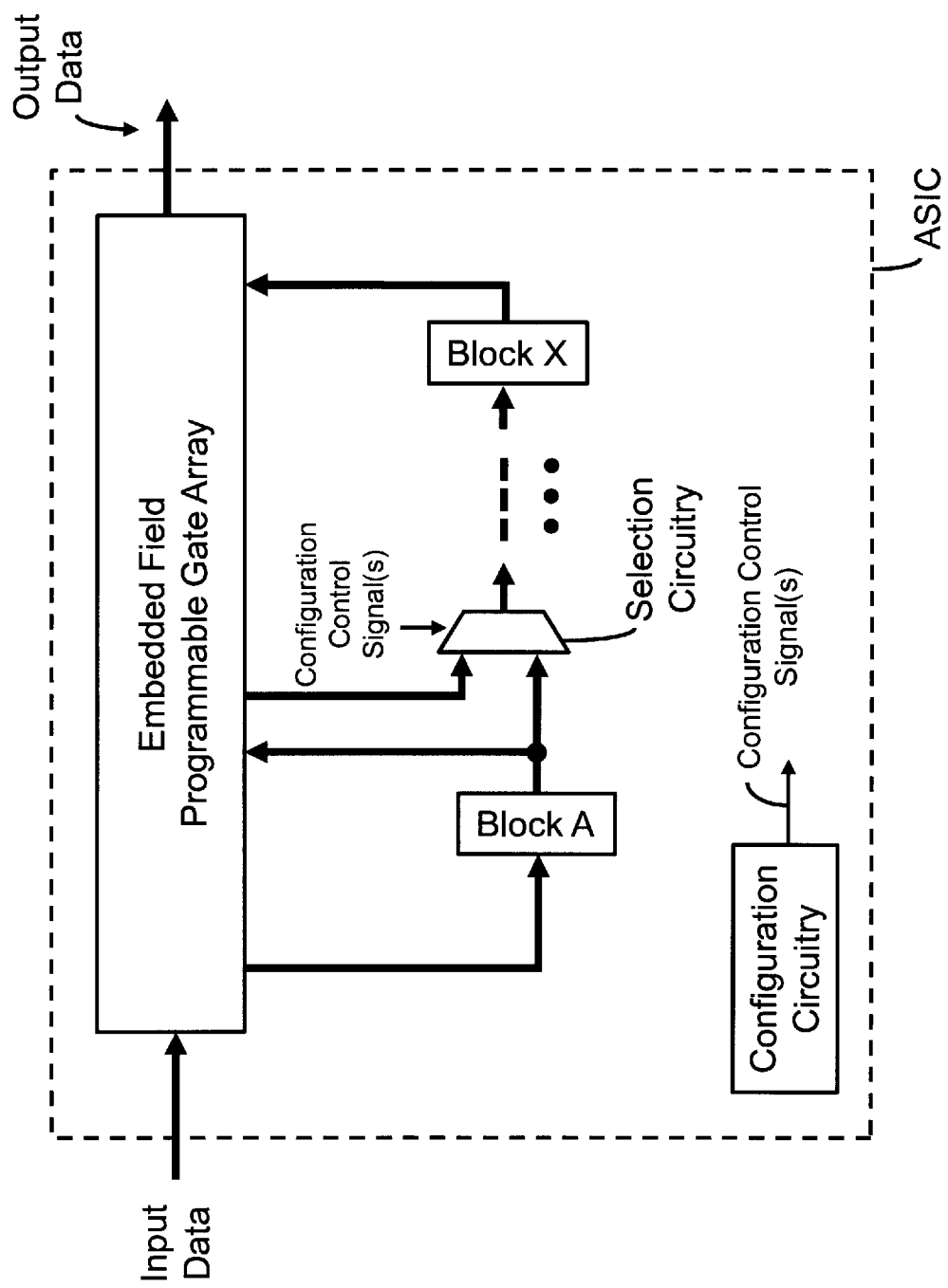

For example, the FPGA and Logic Circuitry (e.g., ASIC) may interface (internally and externally) using any architecture now known or later developed. (See, FIGS. 7A and 7B). Moreover, the integrated circuit may be an ASIC having logic circuitry and an embedded FPGA. (See, FIG. 7C). Indeed, the inventions described and illustrated in herein may be an ASIC including selection circuitry and an embedded FPGA to implement the reconfigurable data processing path or pipeline.

Further, with reference to FIGS. 8A-8D, the reconfigurable data path or pipeline may implement one or more operations (via one or more circuit blocks) in the ASIC and one or more operations (via logic circuitry) in the FPGA. The illustrations of such embodiments are merely exemplary. The integrated circuit includes an FPGA, having logic circuitry to perform one or more operations, embedded in an ASIC wherein the ASIC includes one or more circuit blocks each capable of performing one or more operations. The configuration circuitry controls the selection circuitry to configure or control data flow within the ASIC and/or between the FPGA and the ASIC which facilities configuration or control of the order, number and/or type of data processing operation(s) or function(s) (e.g., digital signal processing, encoding, decoding, encrypting, decrypting and/ or filtering) in/of the data path in the FPGA and/or the ASIC. The FPGA includes an interconnect network to facilitate or provide configuration or control of the order, number and/or type of data processing operation(s) or function(s) in/of the data path in the FPGA (via configurations of the interconnect network and connection thereof to one or more computing elements). The one or more circuit blocks of the ASIC perform predetermined operation(s) or function(s). The selection circuitry responsively implements the configurable or controllable data processing path or pipeline.

Although the selection circuitry is illustrated in FIGS. 8A-8D as being a multiplexer, other circuitry may also be employed to route or re-route the data processing path or pipeline. Moreover, although illustrated as a multiplexer, such circuitry may be a bank or block of multiplexers, for example, to accommodate the size or width of the data path. The location of the selection circuitry may be partially or fully in the ASIC or partially or fully in the embedded FPGA. Moreover, the configuration circuitry may be disposed partially or fully in the ASIC or partially or fully in the embedded FPGA—or separate from both. All combinations are intended to fall within the scope of the present inventions.

As intimated above, although the selection circuitry is, at times, identified by the symbol of a multiplexer—such selection circuitry may be one or more multiplexers. Moreover, the selection circuitry may be implemented using other forms of circuitry—all of which are intended to fall within the scope of the present inventions. Further, where the selection circuitry is implemented using multiplexers before or after a circuit block of the ASIC, in implementation, a bank or plurality of multiplexers may be employed.

Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit or multiple bits.

The techniques described herein may be implemented using control circuitry (e.g., one or more processors (suitably programmed)) to perform, execute and/or assess one or more of the functions or operations described herein to program the data storage elements and thereby configure the robust type memory cell according to the present inventions. Here, the control circuitry (which may be disposed on the integrated circuit) is employed to program the robust type memory cell during initialization or at start-up, and/or in situ such that the output of the robust type memory cell is employed to establish or implement a mode of operation or function in, for example, the logic tile.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

In the claims, and elsewhere, the terms "comprises," "comprising," "includes," "including," "have," and "having" or any other variation thereof, are intended to cover a non-exclusive inclusion, such that a process, method, circuit, article, integrated circuit or apparatus that includes/comprises a list of elements, components, steps (etc.) does not include only those elements, components, steps (etc.) but may include other elements, components, steps (etc.) not expressly listed or inherent to such process, method, circuit, article, integrated circuit or apparatus. Further, in the claims, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

Moreover, in the claims, and elsewhere, the term "logic tile" means a design unit or block of a plurality of transistors (typically more than thousands), which, in this application, is capable of connecting to a plurality of other (e.g., neighboring or adjacent) logic tiles, logic cells, logic cores, configurable logic blocks, logic array blocks and/or logic blocks.

In addition, in the claims, and elsewhere, the term "integrated circuit" means, among other things, a processor, controller, state machine, gate array, SoC, PGA and/or FPGA. The term "integrated circuit" also means, for example, a processor, controller, state machine and SoC—including an embedded FPGA. For the avoidance of doubt, field programmable gate array or FPGA means both an FPGA and an embedded FPGA.

Further, the term "multiplexers", in the claims, means multiplexers and/or switches. The term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. In addition, the term "data" means, among other things, information (plural or singular), for example, provided or contained in a current or voltage signal(s) and/or stored in memory or the like), whether in an analog or a digital form, which may be a single bit (or the like) or multiple bits (or the like).

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "logic tile" means a design unit or block of a plurality of transistors (typically more than thousands), which, in this application, is capable of connecting to a plurality of neighboring "tiles", "cores" or "blocks". The term "multiplexers" means multiplexers and/or switches. Moreover, as noted above, the term (i) "integrated circuit" means, among other things, a processor, controller, state machine, gate array, SOC, PGA and/or FPGA.

The term data processing operations means operations including digital signal processing, encoding, decoding, encrypting, decrypting, multiply-accumulate operations and/or other forms of data manipulation. The term "temporally synchronizes" means temporally aligns, synchronizes and/or delays. The term "initialization sequence/process" means the power-up, start-up, initialization and/or re-initialization operation of the integrated circuit, FPGA and/or ASIC.

In the claims, the term or phrase "mode of operation" means mode of operation of or function of the integrated circuit (or a portion thereof—for example, a mode of operation of or function of the circuitry of an integrated circuit (e.g., an FPGA) or a portion of the circuitry of the integrated circuit). The term "in situ", in the context of this application, means during normal operation of the integrated circuit, FPGA and/or ASIC—and after power-up, start-up or performance/completion of the initialization sequence/process thereof.

What is claimed is:

1. An integrated circuit comprising:
   an FPGA including:
      a switch interconnect network; and
      logic circuitry, coupled to the switch interconnect network, configurable to process data via a plurality of data processing operations;
   an ASIC, electrically coupled to the logic circuitry of the FPGA via the switch interconnect network, the ASIC including:
      a plurality of circuit blocks, each circuit block is configurable to process data via a data processing operation; and
      selection circuitry, coupled to the logic circuitry of the FPGA and the plurality of circuit blocks of the ASIC, configurable to:
         connect one or more of the plurality of circuit blocks of the ASIC and the logic circuitry of the FPGA into a first circuit configuration to perform a first data processing operation, and
         in situ, connect one or more of the plurality of circuit blocks of the ASIC and the logic circuitry of the FPGA into a second circuit configuration to perform a second data processing operation; and
      configuration circuitry, electrically coupled to the selection circuitry, to program the selection circuitry to:
         provide the first circuit configuration to perform a first data processing operation; and
         in situ, provide the second circuit configuration to perform a second data processing operation.

2. The integrated circuit of claim 1 wherein the selection circuitry:
   configures a first data path between one or more of the plurality of circuit blocks of the ASIC and the logic circuitry of the FPGA to provide the first data processing operation and,
   in situ and in response to control signals from the configuration circuitry, configures a second data path between one or more of the plurality of circuit blocks of the ASIC and the logic circuitry of the FPGA to provide the second data processing operation, and
   wherein:
      the first data path includes one or more circuit blocks of the ASIC and the second data path includes one or more circuit blocks of the ASIC that is/are different from the one or more circuit blocks of the first data path, and
      the first data path includes circuitry of the FPGA to perform one or more data processing operations and the second data path includes circuitry of the FPGA to perform one or more data processing operations that is/are different from the one or more data processing operations of the first data path.

3. The integrated circuit of claim 2 wherein the selection circuitry includes:
   a plurality of multiplexers to reconfigure, in situ and in response to control signals from the configuration circuitry, a data path between (i) the one or more plurality of circuit blocks and (ii) the logic circuitry of the FPGA.

4. The integrated circuit of claim 1 wherein the selection circuitry:
   configures a first data path between one or more of the plurality of circuit blocks of the ASIC and the logic circuitry of the FPGA to provide the first data processing operation and,
   in situ and in response to control signals from the configuration circuitry, configures a second data path between one or more of the plurality of circuit blocks of the ASIC and the logic circuitry of the FPGA to provide the second data processing operation.

5. The integrated circuit of claim 4 wherein the first data path includes one or more circuit blocks of the ASIC and the second data path includes one or more circuit blocks of the ASIC that is/are different from the one or more circuit blocks of the first data path.

6. The integrated circuit of claim 4 wherein the first data path includes a first order of one or more circuit blocks of the ASIC and the second data path includes a second order of one or more circuit blocks of the ASIC that is/are different from the first order of one or more circuit blocks of the first data path.

7. The integrated circuit of claim 4 wherein the first data path includes circuitry of the FPGA to perform one or more data processing operations and the second data path includes circuitry of the FPGA to perform one or more data processing operations that is/are different from the one or more data processing operations of the first data path.

8. The integrated circuit of claim 4 wherein the first data path includes circuitry of the FPGA to perform a first order of one or more data processing operations and the second data path includes circuitry of the FPGA to perform a second order of one or more data processing operations that is/are different from the first order of one or more data processing operations of the first data path.

9. The integrated circuit of claim 1 wherein the switch interconnect network of the FPGA includes a plurality of multiplexers.

10. An integrated circuit comprising:
    an embedded FPGA including:
       logic circuitry, coupled to a switch interconnect network, configurable to process data via a plurality of data processing operations; and
    an ASIC, electrically coupled to the logic circuitry of the FPGA via the switch interconnect network, the ASIC including:
       a plurality of circuit blocks, each circuit block is configurable to process data via a data processing operation;

selection circuitry, coupled to the logic circuitry of the FPGA and the plurality of circuit blocks of the ASIC, configurable to:
  connect one or more of the plurality of circuit blocks of the ASIC and the logic circuitry of the FPGA into a first circuit to perform a first data processing operation, and
  in situ, connect one or more of the plurality of circuit blocks of the ASIC and the logic circuitry of the FPGA into a second circuit to perform a second data processing operation; and
configuration circuitry, electrically coupled to the selection circuitry, to program the selection circuitry to:
  provide the first circuit to perform a first data processing operation, and
  in situ, provide the second circuit to perform a second data processing operation.

11. The integrated circuit of claim 10 wherein the first circuit includes one or more circuit blocks of the ASIC and the second circuit includes one or more circuit blocks of the ASIC that is/are different from the one or more circuit blocks of the first circuit.

12. The integrated circuit of claim 10 wherein the first circuit includes circuitry of the FPGA to perform one or more data processing operations and the second circuit includes circuitry of the FPGA to perform one or more data processing operations that is/are different from the one or more data processing operations of the first circuit.

13. The integrated circuit of claim 10 wherein the selection circuitry includes:
  a plurality of multiplexers to reconfigure, in situ and in response to control signals from the configuration circuitry, a data path between (i) the one or more plurality of circuit blocks and (ii) the logic circuitry of the FPGA.

14. The integrated circuit of claim 10 wherein the switch interconnect network includes a plurality of interconnected multiplexers.

15. The integrated circuit of claim 10 wherein the selection circuitry:
  configures a first data path between one or more of the plurality of circuit blocks of the ASIC and the logic circuitry of the FPGA to provide the first data processing operation and,
  in situ and in response to control signals from the configuration circuitry, configures a second data path between one or more of the plurality of circuit blocks of the ASIC and the logic circuitry of the FPGA to provide the second data processing operation.

16. The integrated circuit of claim 15 wherein the first data path includes one or more circuit blocks of the ASIC and the second data path includes one or more circuit blocks of the ASIC that is/are different from the one or more circuit blocks of the first data path.

17. The integrated circuit of claim 15 wherein the first data path includes a first order of one or more circuit blocks of the ASIC and the second data path includes a second order of one or more circuit blocks of the ASIC that is/are different from the first order of one or more circuit blocks of the first data path.

18. The integrated circuit of claim 15 wherein the first data path includes circuitry of the FPGA to perform one or more data processing operations and the second data path includes circuitry of the FPGA to perform one or more data processing operations that is/are different from the one or more data processing operations of the first data path.

19. The integrated circuit of claim 15 wherein the first data path includes circuitry of the FPGA to perform a first order of one or more data processing operations and the second data path includes circuitry of the FPGA to perform a second order of one or more data processing operations that is/are different from the first order of one or more data processing operations of the first data path.

\* \* \* \* \*